US012322452B2

(12) United States Patent
Norizuki et al.

(10) Patent No.: US 12,322,452 B2
(45) Date of Patent: Jun. 3, 2025

(54) THREE-DIMENSIONAL MEMORY DEVICE INCLUDING A BIT-LINE-BIAS VERTICAL TRANSISTOR BLOCK AND METHODS OF OPERATING THE SAME

(71) Applicant: WESTERN DIGITAL TECHNOLOGIES, INC., San Jose, CA (US)

(72) Inventors: Naoto Norizuki, Yokkaichi (JP); Hiroki Yabe, Yokohama (JP)

(73) Assignee: Sandisk Technologies, Inc., Milpitas, CA (US)

( * ) Notice: Subject to any disclaimer, the term of this patent is extended or adjusted under 35 U.S.C. 154(b) by 204 days.

(21) Appl. No.: 18/363,518

(22) Filed: Aug. 1, 2023

(65) Prior Publication Data

US 2024/0363170 A1    Oct. 31, 2024

Related U.S. Application Data

(60) Provisional application No. 63/498,915, filed on Apr. 28, 2023.

(51) Int. Cl.
*G11C 16/16* (2006.01)
*G11C 16/04* (2006.01)
(Continued)

(52) U.S. Cl.
CPC .......... *G11C 16/16* (2013.01); *G11C 16/0483* (2013.01); *H01L 24/08* (2013.01); *H01L 24/80* (2013.01); *H01L 25/0657* (2013.01); *H01L 25/18* (2013.01); *H01L 25/50* (2013.01); *H10B 41/27* (2023.02); *H10B 43/27* (2023.02); *H10B 80/00* (2023.02); *H01L 2224/08145* (2013.01); *H01L 2224/80006* (2013.01); *H01L 2224/80895* (2013.01); *H01L 2224/80896* (2013.01); *H01L 2924/1431* (2013.01); *H01L 2924/14511* (2013.01)

(58) Field of Classification Search
CPC ..... G11C 16/16; G11C 16/0483; G11C 16/08; G11C 16/14; H01L 24/08; H01L 24/80; H01L 25/0657; H01L 25/18; H01L 25/50; H01L 2224/08145; H01L 2224/80006; H01L 2224/80895; H01L 2224/80896; H01L 2924/1431; H01L 2924/14511; H10B 41/27; H10B 43/27; H10B 80/00
USPC ..................................... 365/185.24, 185.29
See application file for complete search history.

(56) References Cited

U.S. PATENT DOCUMENTS 9,985,098 B2    5/2018  Matsumoto et al.
10,008,271 B1 *  6/2018  Diep .................. G11C 16/26
(Continued)

OTHER PUBLICATIONS

Endoh et al., "Novel Ultra High-Density Memory with a Stacked-Surrounding Gate Transistor (S-SGT) Structured Cell," IEDM Proc. (2001) 33-36; https:/doi.org/10.1109/iedm.2001.979396.
(Continued)

*Primary Examiner* — Michael T Tran
(74) *Attorney, Agent, or Firm* — THE MARBURY LAW GROUP PLLC

(57) ABSTRACT

A semiconductor device includes a plurality of memory blocks and a bit-line-bias block. A source-drain erase bias voltage is applied between a source line and a bit lines through the bit-line-bias block during an erase operation.

20 Claims, 32 Drawing Sheets

(51) Int. Cl.
    *H01L 23/00*     (2006.01)
    *H01L 25/00*     (2006.01)
    *H01L 25/065*     (2023.01)
    *H01L 25/18*     (2023.01)
    *H10B 41/27*     (2023.01)
    *H10B 43/27*     (2023.01)
    *H10B 80/00*     (2023.01)

(56) References Cited

U.S. PATENT DOCUMENTS

| | | | |
|---|---|---|---|
| 10,008,570 | B2 | 6/2018 | Yu et al. |
| 10,020,363 | B2 | 7/2018 | Ogawa et al. |
| 10,566,059 | B2 | 2/2020 | Diep et al. |
| 10,629,613 | B1 | 4/2020 | Shimizu et al. |
| 10,910,020 | B1 | 2/2021 | Kodate et al. |
| 10,910,060 | B1 * | 2/2021 | Wu ............... G11C 16/08 |
| 11,037,631 | B2 * | 6/2021 | Pachamuthu ...... G11C 16/3445 |
| 11,049,568 | B1 | 6/2021 | Yada |
| 11,121,153 | B1 | 9/2021 | Obu et al. |
| 11,127,759 | B2 | 9/2021 | Obu et al. |
| 11,201,111 | B2 | 12/2021 | Zhao et al. |
| 11,501,835 | B2 | 11/2022 | Yada et al. |
| 2018/0122904 | A1 | 5/2018 | Matsumoto et al. |
| 2018/0122905 | A1 | 5/2018 | Ogawa et al. |
| 2018/0122906 | A1 | 5/2018 | Yu et al. |
| 2019/0287618 | A1 * | 9/2019 | Kimura .................. G11C 7/04 |
| 2019/0333581 | A1 | 10/2019 | Diep et al. |
| 2021/0159169 | A1 | 5/2021 | Zhao et al. |
| 2021/0233592 | A1 * | 7/2021 | Nardi .................. G11C 16/26 |
| 2021/0265379 | A1 | 8/2021 | Obu et al. |
| 2021/0265380 | A1 | 8/2021 | Obu et al. |
| 2023/0016518 | A1 | 1/2023 | Lien et al. |
| 2023/0099107 | A1 | 3/2023 | Zhang et al. |
| 2023/0209821 | A1 | 6/2023 | Ishida |

OTHER PUBLICATIONS

U.S. Appl. No. 17/811,145, filed Jul. 7, 2022, SanDisk Technologies LLC.
U.S. Appl. No. 18/351,181, filed Jul. 12, 2023, SanDisk Technologies LLC.
U.S. Appl. No. 18/351,235, filed Jul. 12, 2023, SanDisk Technologies LLC.
U.S. Appl. No. 18/357,634, filed Jul. 24, 2023, SanDisk Technologies LLC.
U.S. Appl. No. 18/359,697, filed Jul. 26, 2023, SanDisk Technologies LLC.

* cited by examiner

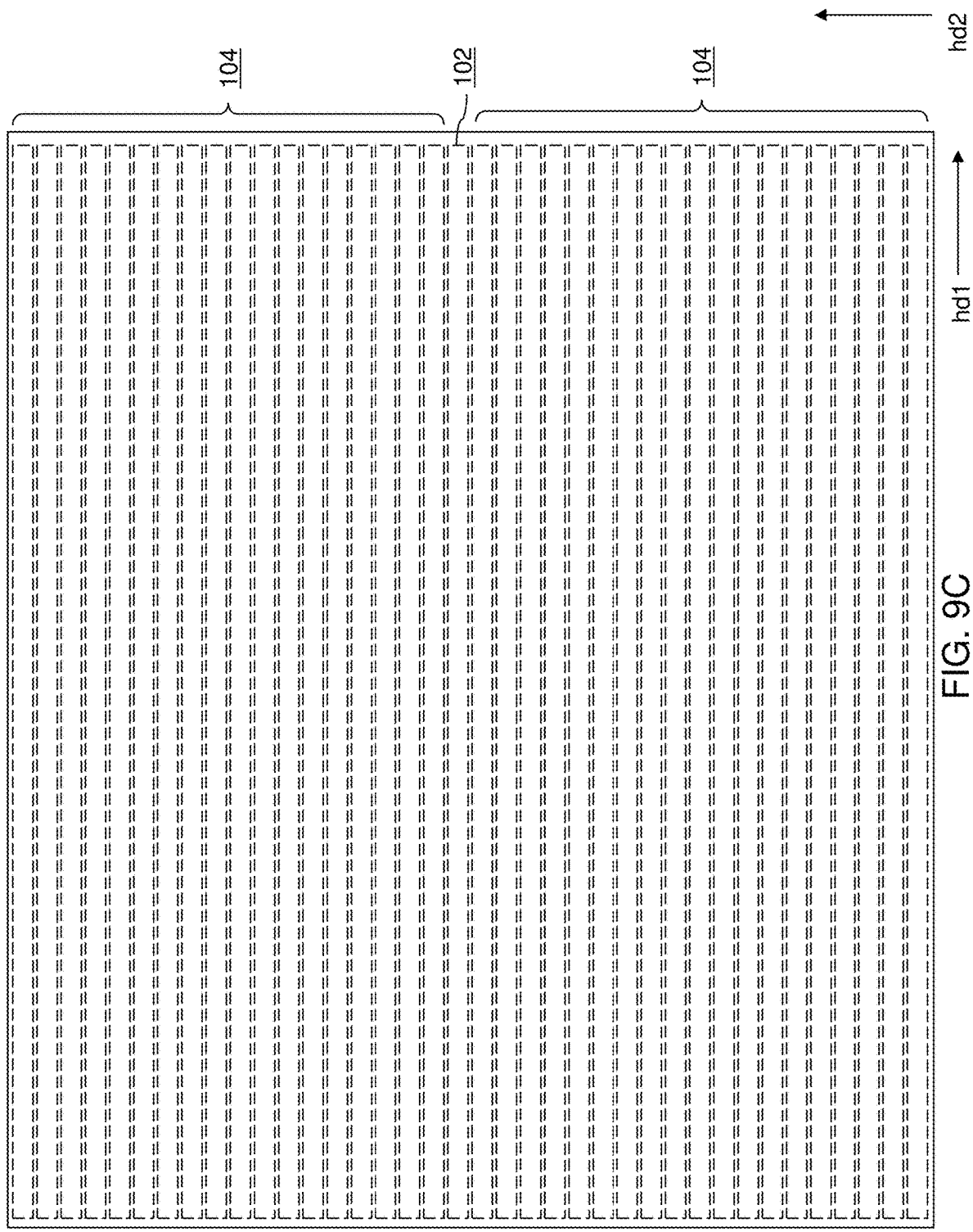

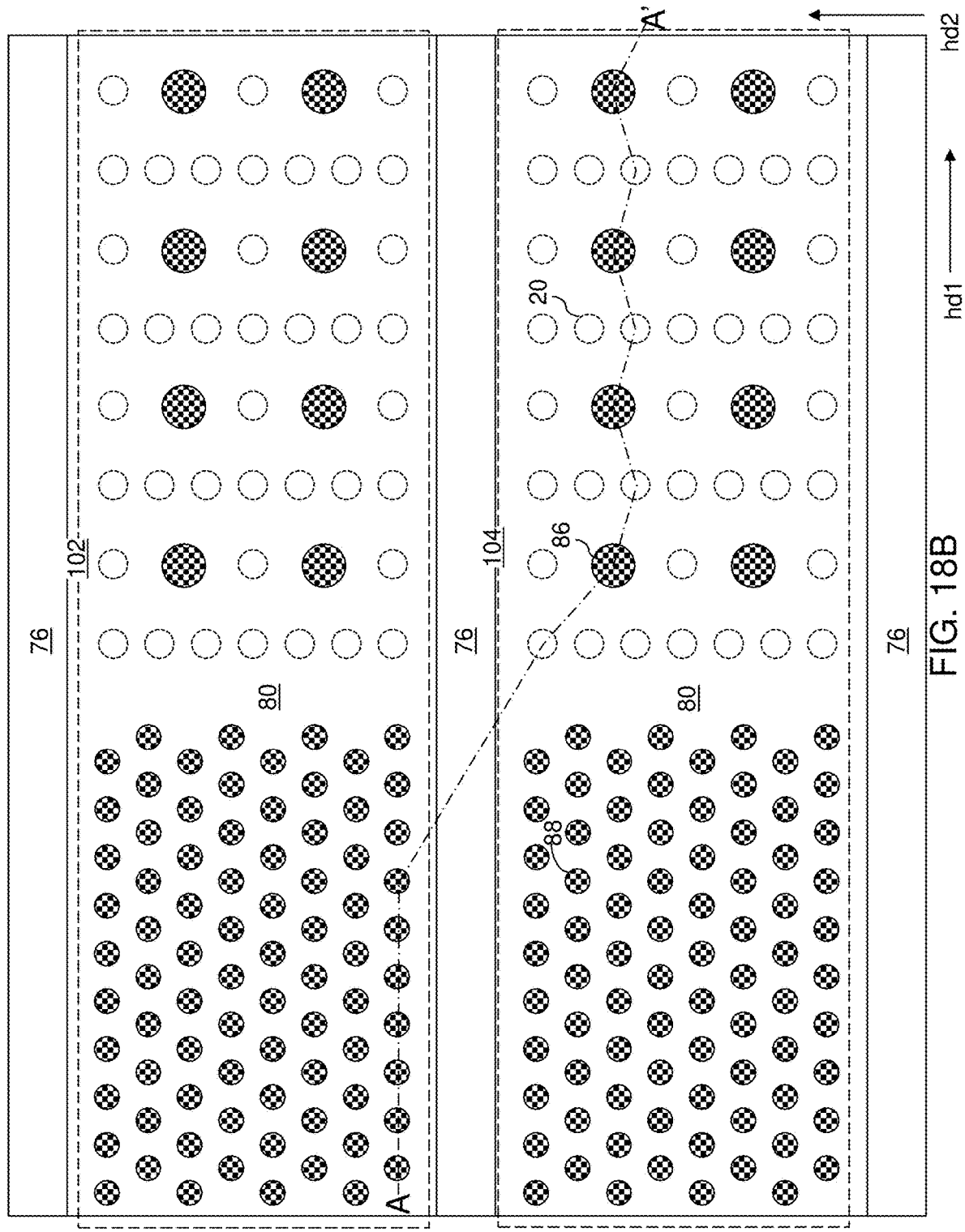

THREE-DIMENSIONAL MEMORY DEVICE INCLUDING A BIT-LINE-BIAS VERTICAL TRANSISTOR BLOCK AND METHODS OF OPERATING THE SAME

FIELD

The present disclosure relates generally to the field of semiconductor devices, and particularly to a three-dimensional semiconductor device including a bit-line-bias vertical transistor block, methods of operating the same, and methods for manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a semiconductor device is provided, which comprises: a plurality of memory blocks, wherein each memory block within the plurality of memory blocks comprises a respective alternating stack of insulating layers and word lines and a respective two-dimensional array of NAND strings, wherein each of the NAND strings comprises a respective vertical stack of memory elements, a respective vertical semiconductor channel, and a respective drain region; a bit-line-bias block located adjacent to the plurality of memory blocks and comprising an alternating stack of dummy insulating layers and dummy word lines and a two-dimensional array of dummy NAND strings, wherein each of the dummy NAND strings comprises a respective vertical stack of dummy memory elements, a respective dummy vertical semiconductor channel, and a respective dummy drain region; bit lines each extending over the plurality of memory blocks and the bit-line-bias block and electrically connected to a respective drain region within the plurality of memory blocks and to a respective dummy drain region; a source line electrically connected to each end of the vertical semiconductor channels and that dummy vertical semiconductor channels located at an opposite side of the bit lines; and an erase operation control circuit comprising a first set of field effect transistors and configured to electrically bias each of the bit lines and the source line at a source-drain erase bias voltage during an erase operation by turning on each of the dummy vertical semiconductor channels within the bit-line-bias block, while applying a word-line erase bias voltage to word lines within a first selected memory block among the plurality of memory blocks.

According to another aspect of the present disclosure, a method of operating a semiconductor device is provided. The method comprises: providing a semiconductor device that comprises: a plurality of memory blocks, wherein each memory block within the plurality of memory blocks comprises a respective alternating stack of insulating layers and word lines and a respective two-dimensional array of NAND strings, wherein each of the NAND strings comprises a respective vertical stack of memory elements, a respective vertical semiconductor channel, and a respective drain region; a bit-line-bias block located adjacent to the plurality of memory blocks and comprising an alternating stack of dummy insulating layers and dummy word lines and a two-dimensional array of dummy NAND strings, wherein each of the dummy NAND strings comprises a respective vertical stack of dummy memory elements, a respective dummy vertical semiconductor channel, and a respective dummy drain region; bit lines each extending over the plurality of memory blocks and the bit-line-bias block and electrically connected to a respective drain region within each memory block within the plurality of memory blocks and to a respective dummy drain region; and a source line electrically connected to each end of the vertical semiconductor channels and that dummy vertical semiconductor channels located at an opposite side of the bit lines; and performing an erase operation by electrically bias each of the bit lines and the source line at a source-drain erase bias voltage by turning on each of the dummy vertical semiconductor channels within the bit-line-bias block, while applying a word-line erase bias voltage to word lines within a first selected memory block among the plurality of memory blocks.

According to yet another aspect of the present disclosure, a method of manufacturing a semiconductor device is provided. The method comprises: forming a plurality of memory blocks and a bit-line-bias block, wherein each memory block within the plurality of memory blocks comprises a respective alternating stack of insulating layers and word lines and a respective two-dimensional array of NAND strings, wherein each of the NAND strings comprises a respective vertical stack of memory elements, a respective vertical semiconductor channel, and a respective drain region, and wherein the a bit-line-bias block is formed adjacent to the plurality of memory blocks and comprises an alternating stack of dummy insulating layers and dummy word lines and a two-dimensional array of dummy NAND strings, wherein each of the dummy NAND strings comprises a respective vertical stack of dummy memory elements, a respective dummy vertical semiconductor channel, and a respective dummy drain region; forming bit lines, wherein each of the bit lines extends over the plurality of memory blocks and the bit-line-bias block and electrically connected to a respective drain region within each memory block within the plurality of memory blocks and to a respective dummy drain region; forming a source line prior to, or after, forming the plurality of memory blocks and the bit-line-bias block, wherein the source line is electrically connected to each end of the vertical semiconductor channels and that dummy vertical semiconductor channels located at an opposite side of the bit lines; and forming an erase operation control circuit comprising a first set of field effect transistors, wherein the erase operation control circuit is configured to electrically bias each of the bit lines and the source line at a source-drain erase bias voltage during an erase operation by turning on each of the dummy vertical semiconductor channels within the bit-line-bias block, while applying a word-line erase bias voltage to word lines within a first selected memory block among the plurality of memory blocks.

BRIEF DESCRIPTION OF THE DRAWINGS

FIG. 9C is a zoom-out top-down view of the exemplary structure of FIGS. 9A and 9B.

FIG. 18B is a top-down view of the exemplary structure of FIG. 18A. The vertical plane A-A' is the cut plane of the vertical cross-sectional view of FIG. 18A.

DETAILED DESCRIPTION

Figure 1:
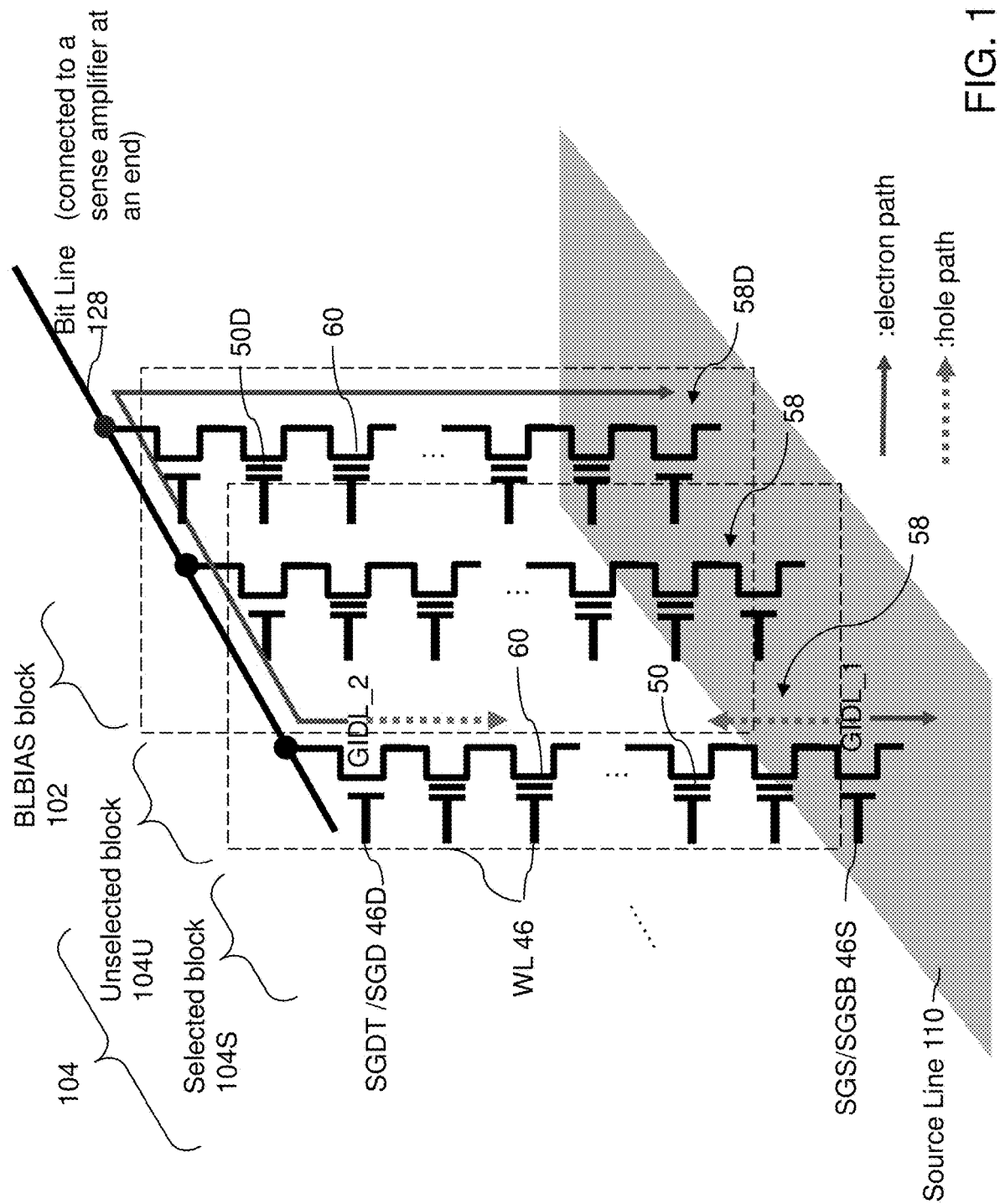
FIG. 1 is a schematic view of a NAND circuit comprising a bit-line-bias block according to an embodiment of the present disclosure.

As discussed above, the present disclosure is directed to a three-dimensional semiconductor device including a bit-line-bias vertical transistor block, methods of operating the same, and methods for manufacturing the same, the various aspects of which are described below. Embodiments of the disclosure can be employed to form various structures including a multilevel memory structure, non-limiting examples of which include semiconductor devices such as three-dimensional memory array devices comprising a plurality of memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, an element located "on" a second element can be located on the exterior side of a surface of the second element or on the interior side of the second element. As used herein, an element is located "directly on" a second element if there exist a physical contact between a surface of the element and a surface of the second element. As used herein, an element is "electrically connected to" a second element if there exists a conductive path consisting of at least one conductive material between the element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased in a single erase operation. Each block contains a number of pages, which are the smallest unit that can be programmed, i.e., a smallest unit on which a read operation can be performed.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

The embodiments of the present disclosure are directed a three-dimensional memory device that replaces high voltage transistors for applying high voltages to bit lines for erase operation and programming operation with NAND strings located in a specialized block, which is hereafter referred to as a bit-line-bias block. Elimination of high voltage transistors from sense amplifier/bit-line-bias circuits decreases the area requirement for the sense amplifier/bit-line-bias circuits. In this case, only sense amplifier circuits need to connected to end portions of the bit lines because high voltage biasing of the bit lines is achieved through one or more of the bit-line-bias blocks. The memory device includes at least one bit-line-bias block and data storage memory blocks. The bit-line-bias block is structurally similar or identical to the data storage memory blocks which are used to store data and which are located in the same memory device as the bit-line-bias block, except that the control signals are provided to the bit-line-bias block by a bit-line-bias block control circuit, while control signals to the data storage memory blocks are provided by regular switching circuits, such as word line switching circuits. High voltage bias transistors can be omitted in a peripheral circuit for controlling the bit lines, and the word lines in the bit-line-bias block may be controlled separately relative to the word lines for the remaining data storage memory blocks of the same memory device. Specifically, the word lines in the bit-line-block can be connected to a erase voltage supply circuit. A bit-line-bias voltage driver can be provided, which functions as a switching circuit for applying various word line bias voltages. The total area required for a CMOS circuitry in a peripheral circuit can be reduced, and the density of memory devices can be increased.

According to an aspect of the present disclosure, erase operations in vertical NAND strings of data storage memory blocks can be performed employing gate induced drain leakage (GIDL) hole currents generated both from a source line and from a bit line. Thus, while the acronym "GIDL" includes the term "drain" it should be understood that as used herein gate induced leakage hole current may be applied from the source side or from both the source and drain sides of the vertical semiconductor channel of a vertical NAND string during the erase operation of the vertical NAND string. The high erase voltage applied to the source line can be routed to the bit line through the vertical NAND strings in the bit-line-bias block such that the erase voltage is applied to the vertical NAND strings in the data storage memory blocks from both the source side and from the drain side. In this case, the vertical NAND strings in the bit-line-bias block are turned on and function as vertical field effect transistors, even though they contain dummy memory cells (e.g., a charge storage layer or discrete charge storage regions). Thus, the peripheral circuit does not require a separate high voltage bit line bias switching transistor for routing the erase voltage from the source line to the bit lines during the gate induced leakage erase operation.

Referring to FIG. 1, a schematic view of a NAND circuit comprising a bit-line-bias (BLBIAS) block 102 and plural data storage memory blocks 104 (e.g., selected and unselected blocks 104S, 104U) is illustrated during an erase operation according to an embodiment of the present disclosure. A single dummy NAND string 58D in the BLBIAS block and single data storage NAND strings 58 in the selected and unselected data storage memory blocks (104S, 104U) are illustrated for clarity. Generally, the BLBIAS block 102 can include a two-dimensional array of dummy NAND strings 58D therein, and the data storage memory blocks 104 include a two-dimensional array of NAND strings 58 therein. As used herein, a dummy NAND string 58D includes a vertical semiconductor channel 60 and a dummy memory film 50D which includes dummy charge storage layer or regions which are capable of but are not used to store data in the form of charge (e.g., as trapped electrons). In contrast, a charge storage NAND string 58 includes the vertical semiconductor channel 60 and the memory film 50 which includes charge storage layer or regions which are used to store data in the form of charge (e.g., as trapped electrons). The BLBIAS block 102 is located adjacent to data storage memory blocks 104 in the same memory device.

During the erase operation, the data storage memory blocks 104 comprise a plurality of unselected memory blocks 104U and at least selected memory block 104S which is being erased. A bottom end of each NAND string (58D, 58) can be connected to a source line 110, which may comprise semiconductor source layer. Each dummy NAND string 58D in the BLBIAS block 102 and the data storage NAND strings 58 in the data storage memory blocks 104 can be electrically connected to a respective bit line 128. Thus, each bit line 128 can be electrically connected to a respective dummy NAND string 58 in the BLBIAS block and at least one respective data storage NAND string 58 in each of the data storage memory blocks 104. Thus, a drain-side end of each data storage NAND string 58 in the data storage memory blocks 104 can be electrically connected to a drain-side end of a respective dummy NAND string 58D in the BLBIAS block 102.

In one embodiment, each of the data storage memory blocks 104 and the BLBIAS block 102 may have a same number of NAND strings (58, 58D) which have the same structure, layout and materials. Thus, the BLBIAS block 102 can be structurally identical to each of the data storage memory blocks 104 except for electrical connections for the various electrically conductive layers that are used as word lines (WL) 46, source-side select gate electrodes 46, which include at least one bottom source-side select gate electrode SGSB and source-side select gate electrodes SGS, and drain-side select gate electrodes 46D which include at least one top drain-side select gate electrode SGDT and drain-side select gate electrodes SGD. The word lines WL, the bottom source-side select gate electrodes SGSB, the source-side select gate electrodes SGS, the top drain-side select gate electrodes SGDT, and the drain-side select gate electrodes SGD for each of the data storage memory blocks 104 are electrically connected to respective control circuits (e.g., word line drivers) as known in the art. The word lines WL, the bottom source-side select gate electrodes SGSB, the source-side select gate electrodes SGS, the top drain-side select gate electrodes SGDT, and the drain-side select gate electrodes SGD for the BLBIAS block 102 are electrically connected to special control circuits that will be described in more detail below. The special control circuits are configured to apply voltages that are selected to activate and deactivate vertical current paths during the erase operation, and to disable the vertical current paths during read operations (i.e., sensing operations) according to an aspect of the present disclosure. Thus, the electrical bias voltage schemes and control circuits for the various electrically conductive layers which function as the word lines WL, the bottom source-side select gate electrodes SGSB, the source-side select gate electrodes SGS, the top drain-side select gate electrodes SGDT, and the drain-side select gate electrodes SGD for the BLBIAS block 102 distinguish the BLBIAS block 102 which is used to form a temporary electrical connection between the source line 110 and the bit lines 128 during an erase operation, from the data storage memory blocks 104 which are used to store data.

During the erase operation, the bit line 128 is biased at a bit line erase bias voltage, which is the same as or is substantially the same as a source erase bias voltage VERA. The word lines 46 (WL) and other select gates (46S, 46D) (SGSB, SGS, SGDT, SGD) are electrically biased at sufficiently high voltages such that all of the dummy NAND strings 58D within the BLBIAS block 102 can be turned on while the channels 60 of the dummy NAND strings 58D within the BLBIAS block 102 are at the source erase bias voltage VERA.

A first gate induced "drain" leakage (GIDL) current (represented as GIDL_1 in FIG. 1) can flow between the source line 110 and each channel 60 of the data storage NAND strings 58 in the selected block 104S (i.e., the block that is selected for an erase operation). Specifically, an electron current (i.e., an electron path) flows from the bottom of the channels 60 to the source line 110, and a hole current (i.e., a hole current path) flows from the bottom of the channels 60 at the source-side select gate electrodes 46S to the drain regions at the tops of the channels 60 to erase the memory cells by recombining the holes with electrons stored in the memory film 50 of the data storage NAND strings 58.

A second GIDL current (represented as GIDL_2 in FIG. 2) can flow between the bit lines 128 and each channel 60 of the NAND strings 58 in the selected block 104S. Specifically, an electron current (i.e., an electron path) flows from the tops of the channels 60 in the selected data storage memory block 104S to the bit lines 128, and then through the channels 60 of the dummy NAND strings 58D within the BLBIAS block 102 to the source line 110. A hole current (i.e., a hole current path) flows from the tops of the channels 60 at the drain-side select gate electrodes 46SD of block 104S toward the middles of the channels 60 to erase the memory cells by recombining the holes with electrons stored in the memory film 50 of the data storage NAND strings 58.

Figure 2:
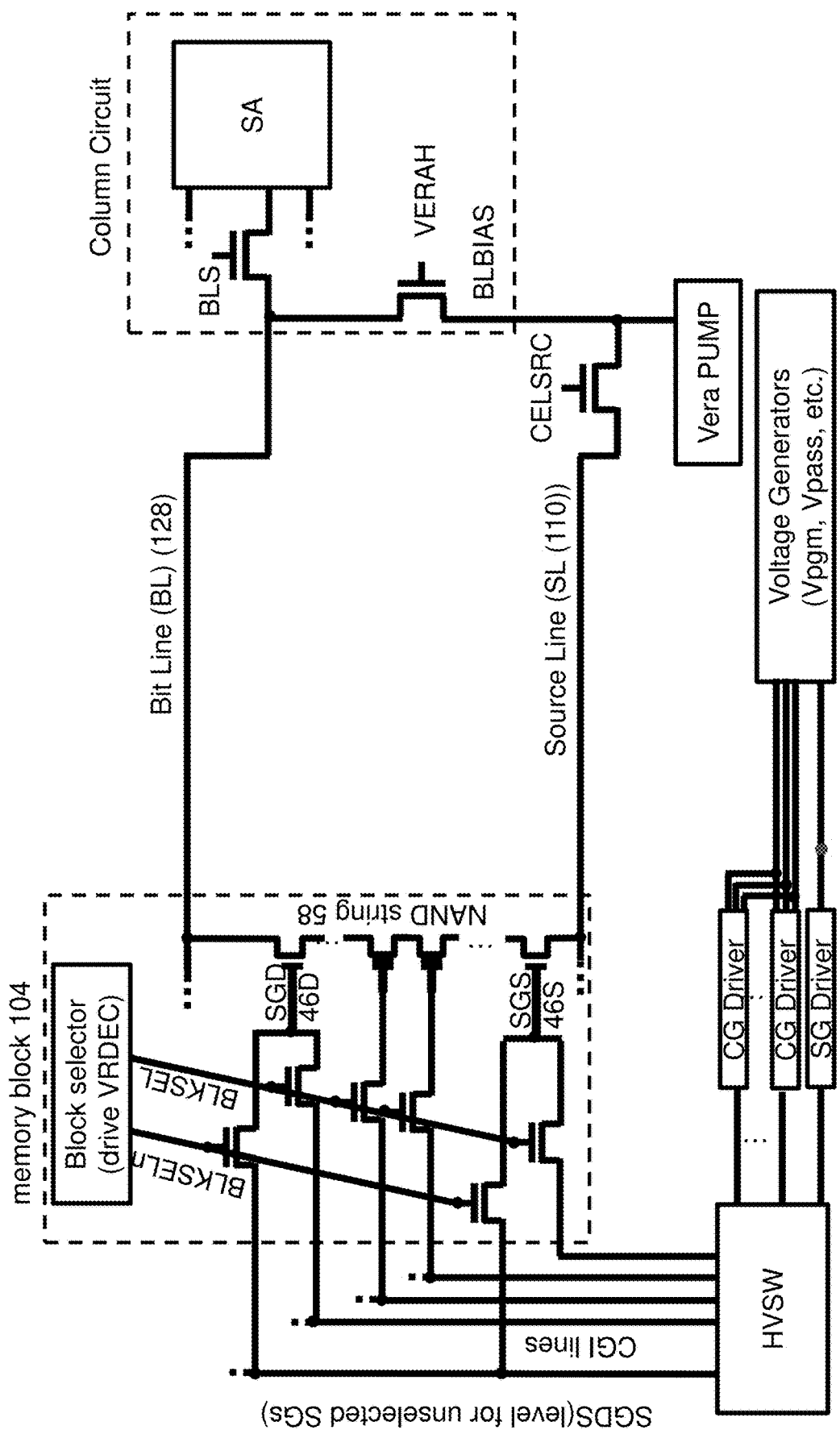
FIG. 2 is a schematic view of a prior art NAND circuit that employs a conventional bit line bias circuit.

Referring to FIG. 2, a prior art NAND circuit is illustrated, which employs a conventional bit line bias circuit. A single data storage memory block 104 is schematically illustrated, which includes a respective set of data storage NAND strings 58. Only a single data storage NAND string 58 within the memory block is illustrated, and a single bit line (BL) 128 that is connected to a drain-side end of the NAND string 58 is illustrated. The NAND string 58 includes a channel extending the vertical direction. Various select gate electrodes (such as bottom source-side select gate electrodes (not expressly shown), source-side select gate electrodes SGS, top drain-side select gate electrodes (not expressly shown), and drain-side select gate electrodes SGD) can be electrically biased by voltages applied via select lines (e.g., BLKSEL and BLKSELn) that are controlled by a block selector circuit that generates a reference voltage for select gate decoding (VRDEC).

Voltage generators for generating various voltages can be provided, which generate control gate (i.e., word line) programming voltages (Vpgm), control gate pass voltages (Vpass), and other control gate voltages. Control gate (CG) drivers (e.g., word line switching circuits) are connected to the voltage generators, and select suitable control gate voltages for each operation to be performed on the memory block 104. High voltage switches (HVSW) are employed to relay the output voltages from the control gate drivers to the control gate input (CGI) lines (which are electrically connected to the word lines) and to any unused select gate electrodes SGDS. Thus, the word lines and the select gate electrodes of the memory block can be suitably biased by a control gate bias circuit for the memory block.

A column circuit comprising a column of sense amplifiers (SA) can be provided. Each sense amplifier SA can be connected to an end portion of a respective bit line 128 through a bit line switch (BLS), which is transistor configured for high voltage switching to withstand the high voltages applied to the respective bit line during an erase operation. Further, the column circuit comprises a column of bit line bias switches BLBIAS, which are transistors which have gate electrodes to which an voltage VERAH is applied during an erase operation. The source erase bias voltage VERA can be generated by an erase voltage generator circuit "Vera PUMP." The source erase bias voltage VERA can be applied to the source line 110 through a source bias switch transistor CELSRC, and can be applied to the bit lines 128 through the channels of the column of bit line bias switching transistors BLBIAS. However, the switching transistors BLBIAS take up a significant amount of space and complete that the column circuit.

Figure 3:
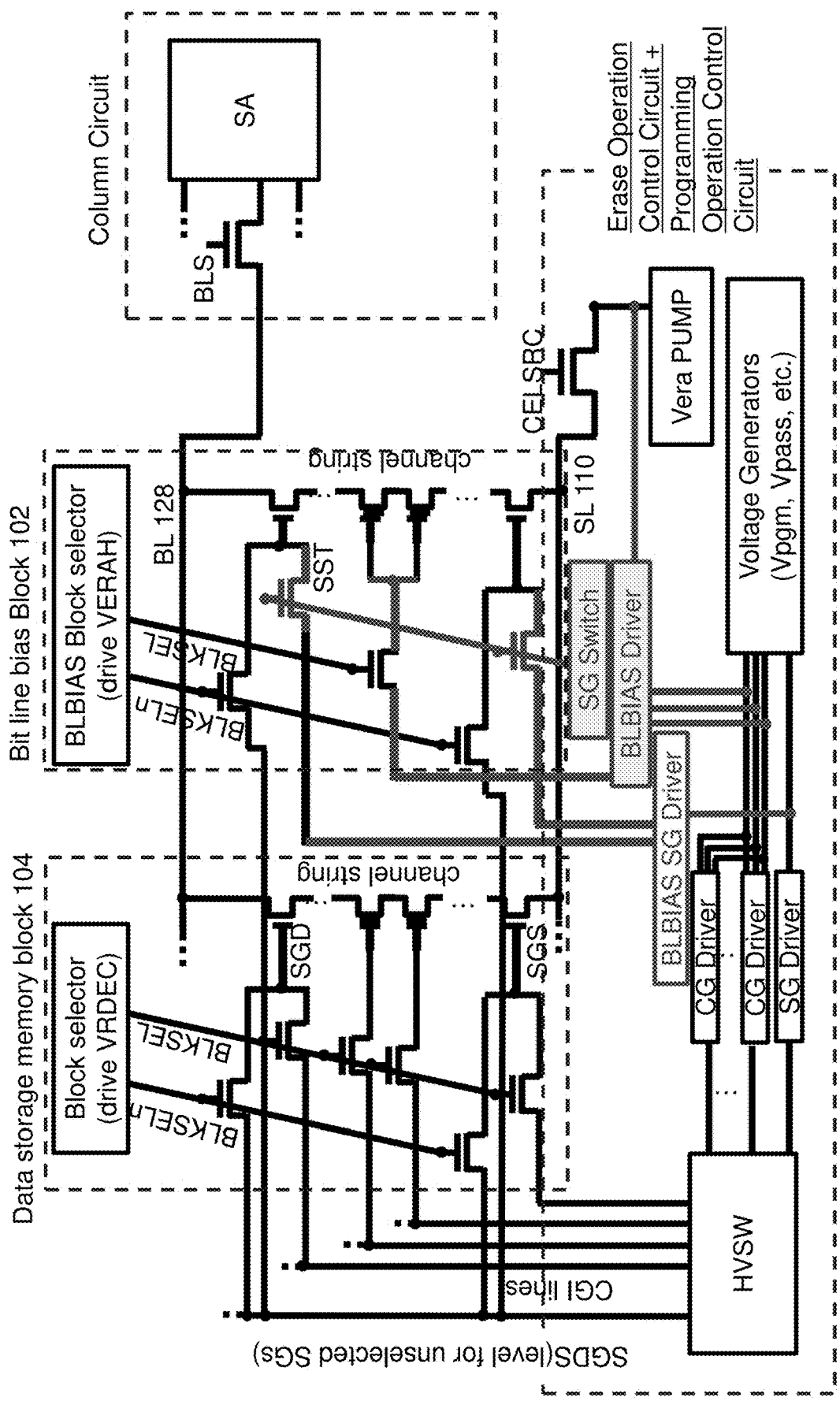
FIG. 3 is another schematic view of the NAND circuit comprising a bit-line-bias block according to an embodiment of the present disclosure.

FIG. 3 is a circuit schematic view of the NAND circuit comprising a bit-line-bias block 102 according to an embodiment of the present disclosure. The schematic view of FIG. 3 illustrates the NAND circuit of FIG. 1 with additional details on how the various electrodes and lines are electrically connected to the BLBIAS block 102.

Generally, an erase operation control circuit and a programming operation control circuit are provided for the NAND circuit of the embodiments of the present disclosure. The drivers for the block select gate electrodes can be electrically biased by BLBIAS block 102 select signal lines (e.g., BLKSEL and BLKSELn) that are controlled by a BLBIAS block selector circuit that generates an erase enable signal (VERAH).

Bit-line-bias-block word line drivers (BLBIAS drivers) can be provided, which are configured to route the various output voltage from the voltage generators and the source erase bias voltage VERA (which is generated by an erase voltage generator circuit "Vera PUMP") to the various word lines of the BLBIAS block. Further, bit-line-bias-block select gate drivers (BLBIAS_SG drivers) can be provided, which are configured to route selected voltage outputs from the voltage generators to each of the sources of the select switch transistors (SST) which have drains electrically connected to the select gate electrodes (such as bottom source-side select gate electrodes (not expressly shown), source-side select gate electrodes SGS 46S, top drain-side select gate electrodes (not expressly shown), and drain-side select gate electrodes SGD 46D) of the BLBIAS block 102. The voltage generators illustrated in FIG. 3 may differ from the voltage generators illustrated in FIG. 2 in that the voltage generators illustrated in FIG. 3 can be configured to provide additional voltage outputs that may be routed to the select gate electrodes of the BLBIAS block 102, but are otherwise not used for data storage memory blocks. In addition, bit-line-bias-block select gate switch circuits (SG_SWITCH) can be provided to provide suitable select gate enable signals to the select gate electrodes of the select switch transistors (SST) for a subset of the select gate electrodes (46S, 46D) of the BLBIAS block 102.

According to an aspect of the present disclosure, the column of bit line bias switching transistors BLBIAS illustrated in FIG. 2 is omitted in the NAND circuit of the embodiments of the present disclosure that is illustrated in FIG. 3. The signal VERAH for activating an erase operation i.e., the erase enable signal, is employed as an enable signal (i.e., an activation or "ON" signal) for the bit-line-bias block 102. Therefore, the column circuit does not include any transistor for routing the source erase bias voltage VERA between the source line 110 and the bit lines 128 during an erase operation. Therefore, the size and complexity of the column circuit can be significantly reduced, which results in reduction of the die size. Generally, the NAND circuit of the embodiments of the present disclosure can be free of any high voltage transistor for applying any bit line bias voltage between the source line 110 and the bit lines 128 within a column circuit area that includes sense amplifiers and drain lines.

Within the bit-line-bias block 102, the word lines 46 are not connected to word line drivers of the word lines 46 of the data storage memory blocks 102, but are instead connected to the bit-line-bias-block word line drivers (BLBIAS drivers), which are configured to route the source erase bias voltage VERA to the word lines of the BLBIAS block during an erase operation. Generally, the bit-line-bias-block word line drivers (BLBIAS drivers) function as switching circuits for the word lines 46 of the BLBIAS block 102 during various operations of the NAND circuit.

The various electrodes of the bit-line-bias block 102 can be electrically biased during the erase operation to provide flow of electrical current through each dummy NAND string 58D in the bit-line-bias block 102. Table 1 illustrates an exemplary gate electrode biasing scheme that may be employed during the erase operation.

TABLE 1

Voltages applied to bit-line-bias block during an erase operation

| Electrode | Bias voltages for a selected block 104S | Bias voltages for unselected blocks 104U | Bias voltages for the bit-line-bias block 102 |
|---|---|---|---|
| Bit line (BL) | VERA (source erase bias voltage) | VERA (source erase bias voltage) | VERA (source erase bias voltage) |
| Top drain-side select gate electrode(s) SGDT | VERA-δ (δ in a range from 0.1 V to 3 V for enhanced GIDL current generation) | VERA (to induce a cut-off) | VERA + η (η in a range from −1.0 V to 1.0 V 0 to ensure that an adjacent channel is turned on) |
| Drain-side select gate electrodes SGD | VERA-γ (γ in a range from 0.1 V to 3 V for enhanced GIDL current generation) | VERA (to induce a cut-off) | VERA + η (η in a range from 0.2 V to 2.0 V to ensure that an adjacent channel is turned on) |

TABLE 1-continued

Voltages applied to bit-line-bias block during an erase operation

| Electrode | Bias voltages for a selected block 104S | Bias voltages for unselected blocks 104U | Bias voltages for the bit-line-bias block 102 |
|---|---|---|---|
| Word lines WL | 0.2 V-1.0 V | Electrically floating | VERA |
| Source-side select gate electrodes SGS | VERA-β (β in a range from 0.1 V to 3 V for enhanced GIDL current generation) | VERA (to induce a cut-off) | VERA + η (η in a range from 0.2 V to 2.0 V to ensure that an adjacent channel is turned on) |
| Bottom source-side select gate electrode(s) SGSB | VERA-α (α in a range from 0.1 V to 3 V for enhanced GIDL current generation) | VERA (to induce a cut-off) | VERA + η (η in a range from 0.2 V to 2.0 V to ensure that an adjacent channel is turned on) |
| Source line SL | VERA (source erase bias voltage) | VERA (source erase bias voltage) | VERA (source erase bias voltage) |

Figure 4:
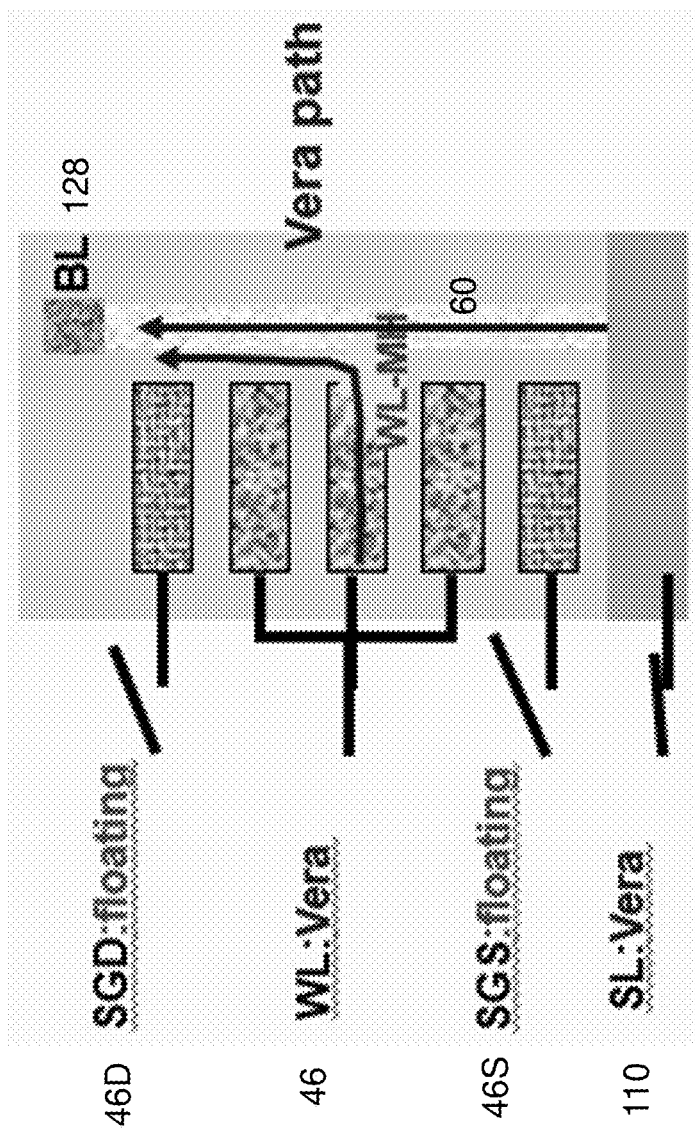
FIG. 4 is a schematic view of a dummy NAND string in the bit-line-bias block during an erase operation according to an embodiment of the present disclosure.

Referring to FIG. 4, an alternative biasing scheme for a bit-line-bias block 102 during an erase operation is schematically illustrated. In this case, the source erase bias voltage VERA may be employed as word line bias voltage for each of the word lines 46 in the bit-line-bias block 102. In this case, the word lines can induce deep erase states for each of the memory elements located in the bit-line-bias block. In this case, select gate electrodes (46D, 46S) (e.g., the top drain-side select gate electrodes SGDT (not illustrated), the drain-side select gate electrodes SGD, the source-side select gate electrodes SGS, and the bottom source-side select gate electrodes SGSB (not illustrated)) may be electrically floating. In this embodiment, the bit lines 128 can be electrically biased at the source erase bias voltage VERA even if leakage currents flow between at least one of the word lines 46 and the vertical semiconductor channel 60 of the dummy NAND strings 58D in the bit-line-bias block 102. Such leakage currents may be cause by time-dependent dielectric breakdown or defects formed in the dummy memory film 50 during a manufacturing process. In other words, even if there is a leak between the channel and at least one word line in the block 102, the block 102 will still function to provide the voltage VERA between the source line 110 and the bit lines 128.

Figure 5:
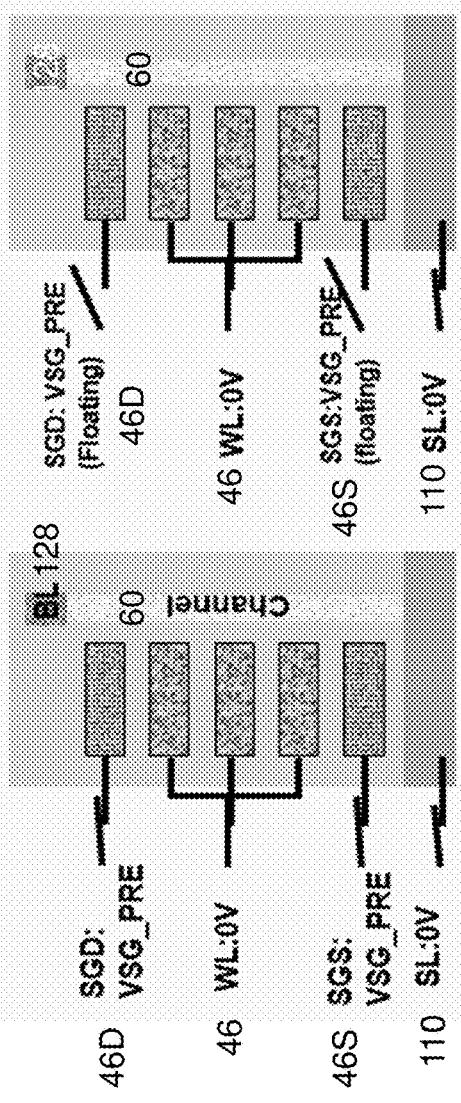
FIG. 5 illustrates sequential schematic views of a dummy NAND string in the bit-line-bias block during an erase operation according to an embodiment of the present disclosure.
Figure 5:
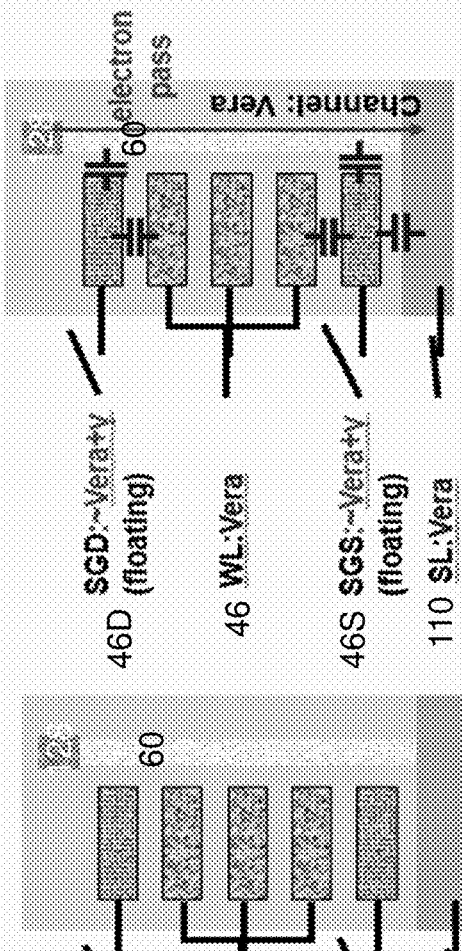
Figure 6:
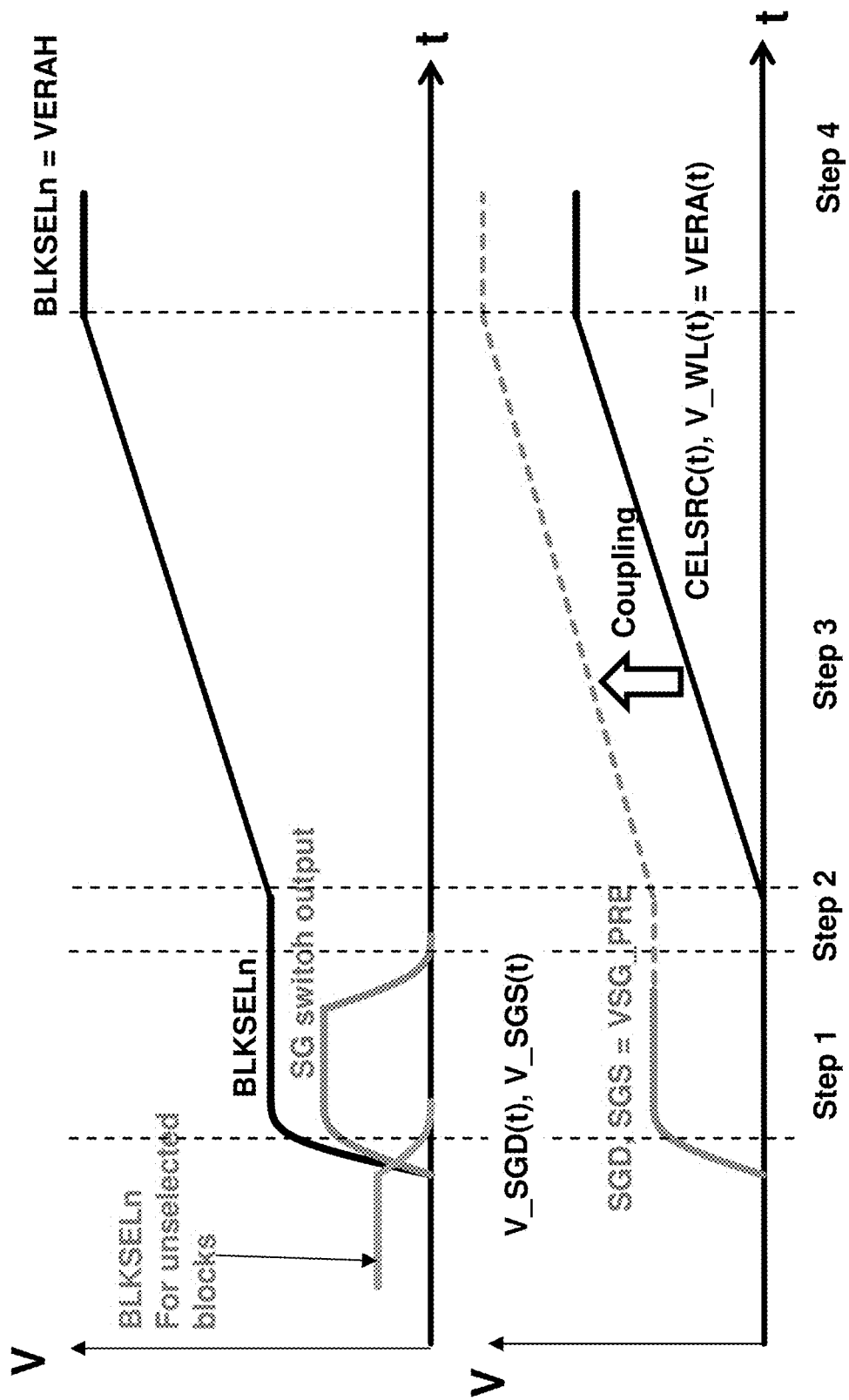
FIG. 6 illustrates waveforms for voltages (i.e., a plot of voltage versus time) that can be applied to various nodes of the dummy NAND string of FIG. 5 in the bit-line-bias block during the erase operation according to an embodiment of the present disclosure.

Referring to FIGS. 5 and 6, another alternative biasing scheme for a bit-line-bias block 102 during an erase operation is schematically illustrated. In this biasing scheme, time-dependent bias voltages may be employed for the various select gate electrodes (46D, 46S) and word lines of the bit-line-bias block 102. Referring to FIG. 6, V_SGD(t) refers to a time-dependent bias voltage applied to the drain-side select gate electrodes (SGD) 46D, and V_SGS(t) refers to a time-dependent bias voltage for the source-side select gate electrodes (SGS) 46S.

Referring to the first step (step 1) illustrated in FIGS. 5 and 6, the drain-side select gate electrodes SGD (and the top drain-side select gate electrode(s) SGDT) 46D and the source-side select gate electrodes SGS (and the bottom source-side select gate electrode(s) SGSB) 46S of the bit-line-bias block 102 can be electrically biased at a select gate pre-charge voltage VSG_PRE, which is lower than the source erase bias voltage VERA. For example, the select gate pre-charge voltage VSG_PRE may be in a range from 1 V to 10 V, such as from 2 V to 6 V, although lower and higher voltages may also be employed. The word lines 46 of the bit-line-bias block 102 can be biased at 0 V at this processing step.

Referring to the second step (step 2) illustrated in FIGS. 5 and 6, the drain-side select gate electrodes SGD (and the top drain-side select gate electrode(s) SGDT) 46D and the source-side select gate electrodes SGS (and the bottom source-side select gate electrode(s) SGSB) 46S of the bit-line-bias block 102 can be electrically disconnected from the BLBIAS SG Driver circuit shown in FIG. 3, and can become electrically floating. The word lines 46 of the bit-line-bias block 102 can be electrically biased at 0 V at this step.

Referring to the third step (step 3) illustrated in FIGS. 5 and 6, the voltage applied to the source line 110 and the word lines 46 of the bit-line-bias block 102 can be gradually ramped from 0 V to the source erase bias voltage VERA while the select gate electrodes (46D, 46S) (i.e., the drain-side select gate electrodes SGD, the top drain-side select gate electrodes SGDT, the source-side select gate electrodes SGS, and the bottom source-side select gate electrodes SGSB) are electrically floating. The capacitive coupling of the adjacent word lines 46 and the channel 60 with each of the drain-side select gate electrodes SGD, the top drain-side select gate electrodes SGDT, the source-side select gate electrodes SGS, and the bottom source-side select gate electrodes SGSB causes the floating voltages to rise to a voltage above VERA (e.g., to VERA+h) with the voltage at the source line 110 and the channel 60 at each of the drain-side select gate electrodes SGD, the top drain-side select gate electrodes SGDT, the source-side select gate electrodes SGS, and the bottom source-side select gate electrodes SGSB.

Referring to the fourth step (step 4) illustrated in FIG. 6, the voltages at the source line 110 and the channel 60 reach the source erase bias voltage VERA, and the voltages at the drain-side select gate electrodes SGD, the top drain-side select gate electrodes SGDT, the source-side select gate electrodes SGS, and the bottom source-side select gate electrodes SGSB reach a respective target voltage of VERA+h, which may be the same as the voltage VERA+h described in FIG. 1.

Therefore, in the embodiment of FIGS. 5 and 6, only a small bias is applied between the select gate electrodes (46D, 46S) and the channel 60 even if there is a leak between the channel 60 and one of the electrodes (e.g., word lines or the select gate electrodes). Furthermore, only a small pre-charge voltage is sufficient to turn on the select gate electrodes to provide select gate bias voltage higher than VERA without an additional high voltage pump circuit.

Generally, the circuit of the embodiments of the present disclosure is resistant to various types of failure modes caused by electrical shorts within the bit-line-bias block 102. Calculations show that use of a single bit-line-bias block 102 can result in a bit line charge time of about 1 microsecond for a typical three-dimensional NAND device. Use of multiple bit-line-bias blocks 102 can reduce the bit line charge time by a factor that approximately equals the number of bit-line-bias blocks employed.

In one embodiment, a deep erase state for word lines in the bit-line-bias block in order to turn on the channels of the bit-line-bias block while the channels are biased at the source erase bias voltage VERA. VERA Pump may be employed to provide bias voltages to the word lines if the threshold voltage is less than 0 V for the transistors in the NAND strings of the bit-line-bias block.

As for the select gate electrodes, the threshold voltages for the select gate electrodes can be preferably greater than 0 V to ensure that the channel current is cut off during the read operation for normal memory blocks. Thus, the bias voltage that is applied to the various select gate electrodes to turn on the NAND strings of the bit-line-bias block can be higher, for example, by the incremental voltage h, than the source erase bias voltage VERA. Such a higher voltage can be applied to the select gate electrodes (46D, 46S) of the bit-line-bias block employing the scheme described with reference to FIGS. 5 and 6.

In one embodiment, the word lines of the bit-line-bias block may be biased to ensure that electrical current does not pass through any channel in the bit-line-bias block. In case the BLBIAS block 102 does not have any leakage current caused by select gate electrodes, the word lines may be biased at a voltage less than 0 V, and the select gate electrodes may be biased at voltages of about 3 V. In case the BLBIAS block 102 has a leakage current at a select gate electrode level, the word lines may be biased in a manual block write mode, for example, at a voltage of about 1 V. In this case, other select gate electrodes that do not exhibit leakage current may be electrically biased at voltages of about 3 V.

In summary, the embodiments of the present disclosure provide a semiconductor device comprising a plurality of memory blocks (e.g., the data storage memory blocks) 104. Each memory block 104 within the plurality of memory blocks comprises a respective alternating stack of insulating layers 32 and word lines 46 and a respective two-dimensional array of NAND strings 58. Each of the NAND strings comprises a respective vertical stack of memory elements (e.g., portions of the memory film 50), a respective vertical semiconductor channel 60, and a respective drain region 63. The semiconductor device further comprises a bit-line-bias block 102 located adjacent to the plurality of memory blocks 104 and comprising an alternating stack of dummy insulating layers 32 and dummy word lines 46 and a two-dimensional array of dummy NAND strings 58D, wherein each of the dummy NAND strings 58D comprises a respective vertical stack of dummy memory elements (e.g., portions of the dummy memory film 50D), a respective dummy vertical semiconductor channel 60, and a respective dummy drain region 63. The semiconductor device further comprises bit lines 128 each extending over the plurality of memory blocks 104 and the bit-line-bias block 102 and electrically connected to a respective drain region 63 within each memory block 104 within the plurality of memory blocks and to a respective dummy drain region 63; a source line 110 electrically connected to each end of the vertical semiconductor channels 60 and that dummy vertical semiconductor channels 60 located at an opposite side of the bit lines 128; and an erase operation control circuit comprising configured to apply a source-drain erase bias voltage VERA between the source line 110 and the bit lines 128 through the dummy vertical semiconductor channels 60 within the bit-line-bias block 120 during an erase operation.

In one embodiment, the erase operation control circuit is configured to perform the erase operation to erase a first selected memory block 104S of the plurality of memory blocks 104 by applying a word-line erase bias voltage to word lines 46 within the first selected memory block 104S of the plurality of memory blocks while applying the source-drain erase bias voltage VERA between the source line and the bit lines through the dummy vertical semiconductor channels within the bit-line-bias block.

In one embodiment, the erase operation control circuit is configured to erase the first selected memory block 104S by generating a gate induced leakage hole current from both source and drain sides of the vertical semiconductor channels 60 in the first selected memory block 104S.

In one embodiment, the gate induced leakage hole current induces a first fraction of trapped electrons within the first selected memory block 104S to be discharged during the erase operation by flowing from a first subset of charge storage elements within the first selected memory block, through first portions of vertical semiconductor channels 60 within the first selected memory block, and through the source line 110, and to induce a second fraction of the trapped electrons within the first selected memory block 104S to be discharged during the erase operation by flowing from a second subset of the charge storage elements within the first selected memory block, through second portions of vertical semiconductor channels 60 within the first selected memory block, through the bit lines 128, through the dummy vertical semiconductor channels 60, and through the source line 110.

In one embodiment, the bit lines may be electrically connected only to the respective drain region within each memory block within the plurality of memory blocks; the respective dummy drain region; and a source or drain of a respective bit line switching transistor BLS and another one of the source or the drain region that is electrically connected to a respective sense amplifier SA.

In one embodiment, the semiconductor device comprises a control circuit configured to maintain each memory cell within the two-dimensional array of dummy NAND strings in an unprogrammed state that is free of electrical charges prior to performing the erase operation. In this case, the electrical current through the channels of the NAND strings in the BLBIAS block can be enhanced during the erase operation.

In one embodiment, the erase operation control circuit is configured to electrically bias each of the dummy word lines within the bit-line-bias block at a respective word line bias voltage that is not less than the source-drain erase bias voltage. In one embodiment, each of the plurality of memory blocks 104 comprises at least one source-side block select electrode 46S and at least one drain-side block select electrode 46D; and the erase operation control circuit is configured to electrically bias, during the erase operation, each source-side block select electrode 46S and each drain-side block select electrode 46D within the first selected memory block 104S at a respective bias voltage that is less than the source-drain erase bias voltage by greater than 0V and less than 2 V. In one embodiment, the bit-line-bias block 102 comprises at least one dummy source-side block select electrode 46S and at least one dummy drain-side block select electrode 46D; and the erase operation control circuit is configured to electrically bias, during the erase operation, each dummy source-side block select electrode and each dummy drain-side block select electrode within the bit-line-bias block at a respective bias voltage that is greater than the source-drain erase bias voltage.

In an alternative embodiment of FIGS. 5 and 6, the select electrodes (46D, 46S) are raised to a voltage greater than the source-drain erase bias voltage by pre-charging the at least one dummy source-side block select electrode and the at least one dummy drain-side block select electrode; allowing the at least one dummy source-side block select electrode and the at least one dummy drain-side block select electrode to float after the pre-charging; and allowing the at least one dummy source-side block select electrode and the at least one dummy drain-side block select electrode to charge to the voltage that is greater than the source-drain erase bias voltage by capacitive coupling at least one of the adjacent dummy word lines 46 or the dummy vertical semiconductor channel 60.

In one embodiment, the erase operation control circuit is configured to electrically isolate the word lines in each of unselected blocks in the plurality of memory blocks during the erase operation such that the word lines in each of the unselected blocks are electrically floating.

In one embodiment, the dummy insulating layers 32 comprise a same material and thickness as the insulating layers 32; the dummy word lines 46 comprise a same material and thickness as the word lines 46; the vertical stack of dummy memory elements 50D comprises a same material and thickness as the vertical stack of memory elements 50; the dummy vertical semiconductor channel 60 has a same material and thickness as the vertical semiconductor channel 60; and the dummy drain region 63 has a same material and thickness as the drain region 63.

The NAND circuit described above can be implemented in a three-dimensional memory device in many different ways. An exemplary implementation of the NAND circuit of the embodiments of the present disclosure is described below employing an exemplary structure, which should not be considered to limit implementation of the NAND circuit of the embodiments of the present disclosure to a particular physical structure in any manner. In other words, while a particular exemplary structure of a semiconductor device is illustrated in an exemplary embodiment below, the implementation of the NAND circuit of the embodiments of the present disclosure is not limited to the exemplary structure described below.

Figure 7:
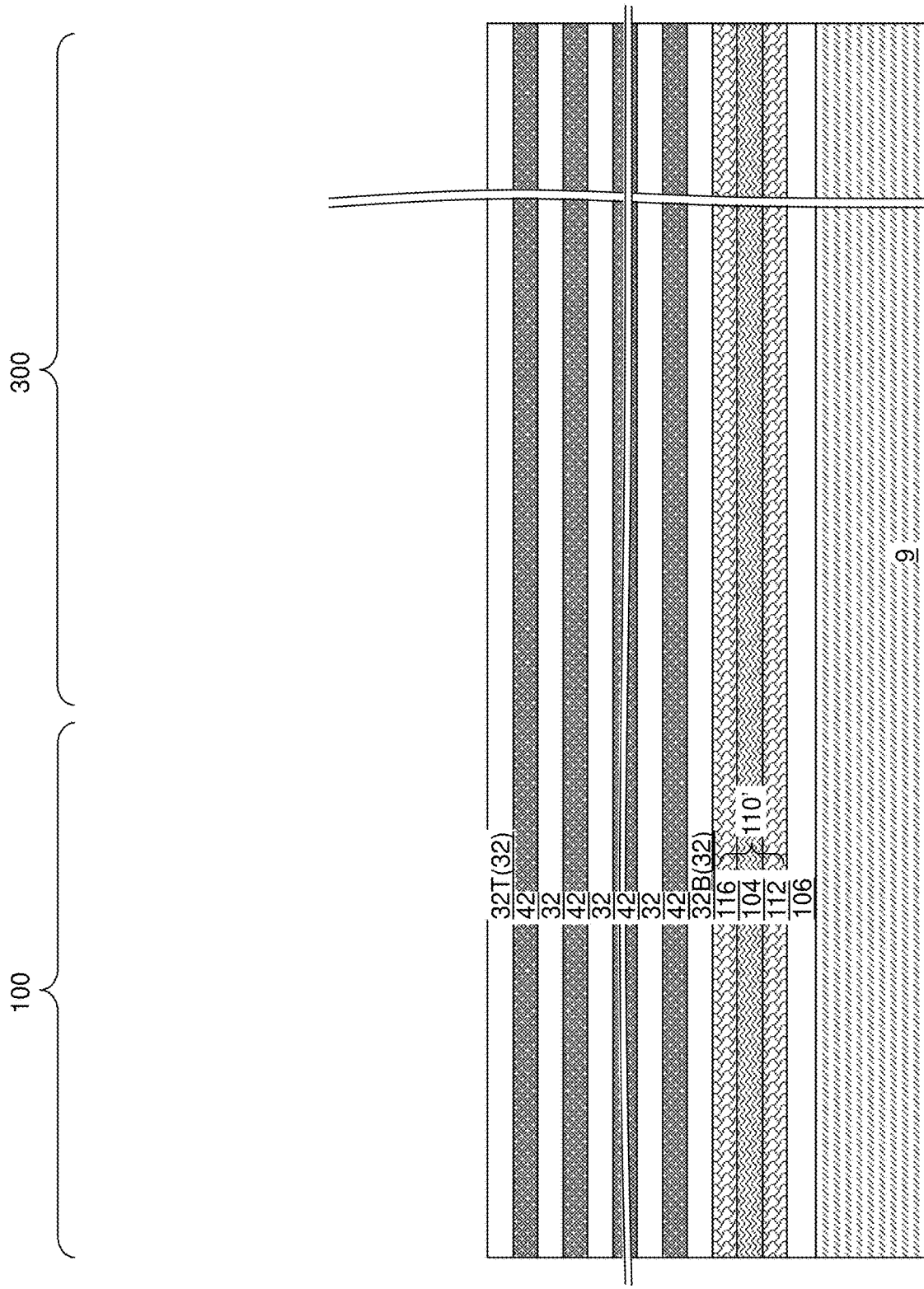
FIG. 7 is a schematic vertical cross-sectional view of an exemplary structure for forming a memory die after formation of a stopper insulating layer, source-level material layers, and an alternating stack of insulating layers and sacrificial material layers over a carrier substrate according to an embodiment of the present disclosure.

Referring to FIG. 7, an exemplary structure according to an embodiment of the present disclosure is illustrated. The exemplary structure comprises a carrier substrate 9, which may be a semiconductor substrate or a conductive substrate. For example, the carrier substrate 9 may comprise a commercially available silicon wafer. Alternatively, the carrier substrate 9 may comprise any material that may be removed selective the materials of insulating layers 32 and dielectric material portions to be subsequently formed.

An insulating material layer can be formed on a top surface of the carrier substrate 9. The insulating material layer can be subsequently employed as a stopping material layer for a process that removes the carrier substrate 9, and is herein referred to as a stopper insulating layer 106, or as a backside pad dielectric layer. If a polishing process such as a chemical mechanical polishing process is employed to subsequently remove the carrier substrate 9, the stopper material layer 106 may be subsequently employed as a polishing stopper material layer. If an etch process such as a wet etch process is employed to subsequently remove the carrier substrate 9, the stopper material layer 106 may be subsequently employed as an etch stop material layer. In one embodiment, the stopper insulating layer 106 comprises a dielectric material such as undoped silicate glass, a doped silicate glass, or silicon nitride. The thickness of the stopper insulating layer 106 may be in a range from 50 nm to 600 nm, such as from 100 nm to 300 nm, although lesser and greater thicknesses may also be employed.

In-process source-level material layers 110' can be formed over the stopper insulating layer 106. The in-process source-level material layers 110' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 110' may include, from bottom to top, a lower source-level semiconductor layer 112, an optional lower sacrificial liner (not shown), a source-level sacrificial layer 104, an optional upper sacrificial liner (not shown), and an upper source-level semiconductor layer 116.

The lower source-level semiconductor layer 112 and the upper source-level semiconductor layer 116 may include a doped semiconductor material such as doped polysilicon or doped amorphous silicon. The conductivity type of the lower source-level semiconductor layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level semiconductor layer 112 and the upper source-level semiconductor layer 116 have a doping of a second conductivity type that is the opposite of the first conductivity type. The thickness of each of the lower source-level semiconductor layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner (or selective to the lower source-level semiconductor layer 112) and the upper sacrificial liner (or selective to the upper source-level semiconductor layer 116). In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used. The lower sacrificial liner (if present) and the upper sacrificial liner (if present) include materials that may function as an etch stop material during removal of the source-level sacrificial layer 104. For example, the lower sacrificial liner and the upper sacrificial liner may include silicon oxide, silicon nitride, and/or a dielectric metal oxide. In one embodiment, each of the lower sacrificial liner and the upper sacrificial liner may include a silicon oxide layer having a thickness in a range from 2 nm to 30 nm, although lesser and greater thicknesses may also be used.

An alternating stack of first material layers and second material layers can be formed over the in-process source-level material layers 110'. The first material layers may be insulating layers, and the second material layers may be spacer material layers. In one embodiment, the spacer material layers may comprise sacrificial material layers 42. In this case, an alternating stack (32, 42) of insulating layers 32 and sacrificial material layers 42 can be formed over the in-process source-level material layers 110'. The insulating layers 32 comprise an insulating material such as undoped silicate glass or a doped silicate glass, and the sacrificial material layers 42 comprise a sacrificial material, such as silicon nitride or a silicon-germanium alloy. In one embodiment, the insulating layers 32 (i.e., the first material layers) may comprise silicon oxide layers, and the sacrificial material layers 42 (i.e., the second material layers) may comprise silicon nitride layers. The alternating stack (32, 42) may comprise multiple repetitions of a unit layer stack including an insulating layer 32 and a sacrificial material layer 42. The total number of repetitions of the unit layer stack within the alternating stack (32, 42) may be, for example, in a range from 8 to 1,024, such as from 32 to 256, although lesser and greater number of repetitions may also be employed. The topmost one of the insulating layers 32 is hereafter referred to as a topmost insulating layer 32T. The bottommost one of the insulating layers 32 is an insulating layer 32 that is most proximal to the carrier substrate 9 is herein referred to as a bottommost insulating layer 32B.

Each of the insulating layers 32 other than the topmost insulating layer 32 may have a thickness in a range from 20 nm to 100 nm, such as from 30 nm to 60 nm, although lesser and greater thicknesses may also be employed. Each of the sacrificial material layers 42 may have a thickness in a range from 20 nm to 100 nm, such as from 30 nm to 60 nm, although lesser and greater thicknesses may also be employed. In one embodiment, the topmost insulating layer 32 may have a thickness of about one half of the thickness of other insulating layers 32.

The exemplary structure comprises a memory array region 100 in which a three-dimensional array of memory elements is to be subsequently formed, and a contact region 300 in which layer contact via structures contacting word lines are to be subsequently formed.

While an embodiment is described in which the spacer material layers are formed as sacrificial material layers 42, the spacer material layers may be formed as electrically conductive layers in an alternative embodiment. Generally, spacer material layers of the present disclosure may be formed as, or may be subsequently replaced at least partly with, electrically conductive layers.

Figure 8:
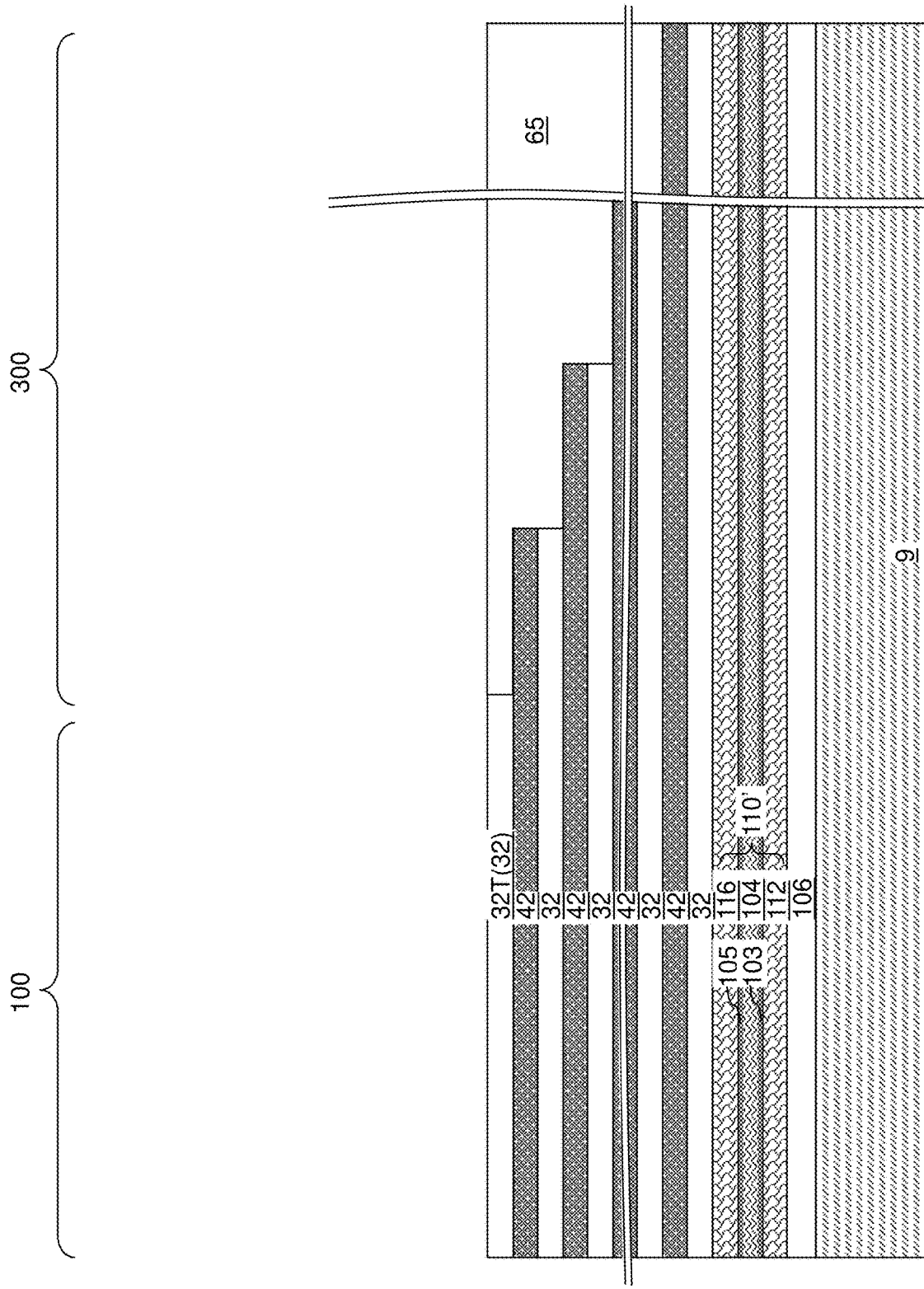
FIG. 8 is a schematic vertical cross-sectional view of the exemplary structure after formation of stepped surfaces and a retro-stepped dielectric material portion according to an embodiment of the present disclosure.

Referring to FIG. 8, stepped surfaces are formed in the contact region 300. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The stepped cavity can have various stepped surfaces such that the horizontal cross-sectional shape of the stepped cavity changes in steps as a function of the vertical distance from the top surface of the in-process source-level material layers 110'. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The stepped surfaces of the alternating stack (32, 42) continuously extend from a bottommost layer within the alternating stack (32, 42) (such as the bottommost insulating layer 32B) to a topmost layer within the alternating stack (32, 42) (such as the topmost insulating layer 32T).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the topmost insulating layer 32T, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures (not shown) can be formed through the topmost insulating layer 32T and a subset of the sacrificial material layers 42 located at drain-select-levels. The drain-select-level isolation structures can be formed, for example, by forming drain-select-level lateral isolation trenches and filling the drain-select-level lateral isolation trenches with a dielectric material such as silicon oxide. Excess portions of the dielectric material can be removed from above the top surface of the topmost insulating layer 32T.

Figure 9A:
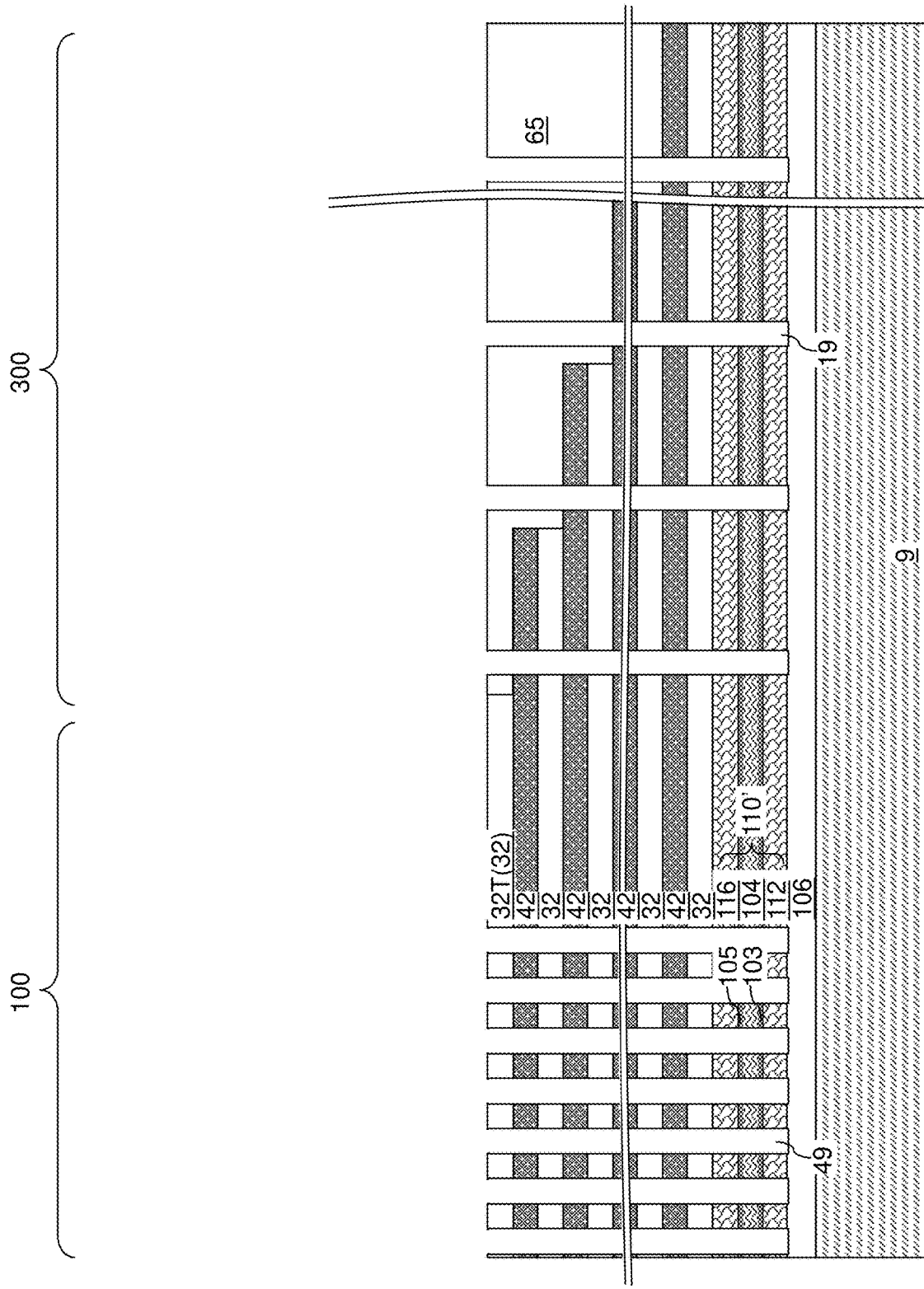
FIG. 9A is a schematic vertical cross-sectional view of the exemplary structure after forming memory openings and support openings according to an embodiment of the present disclosure.
Figure 9B:
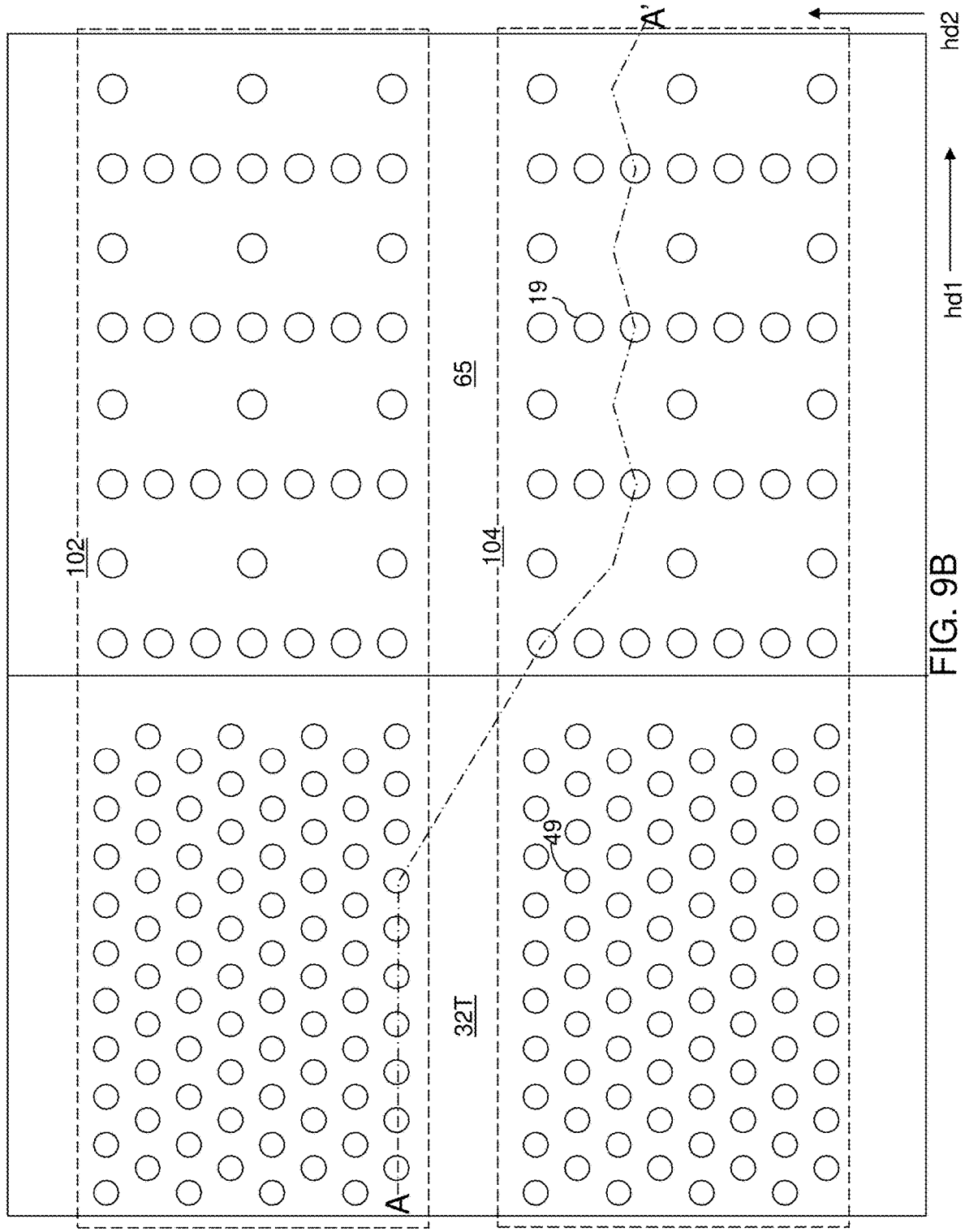
FIG. 9B is a top-down view of the exemplary structure of FIG. 9A. The vertical plane A-A' is the cut plane of the vertical cross-sectional view of FIG. 9A.

Referring to FIGS. 9A-9C, an etch mask layer (not shown) can be formed over the alternating stack (32, 42), and can be lithographically patterned to form various openings therein. An anisotropic etch process can be performed to transfer the pattern of the openings in the etch mask layer through the alternating stack (32, 42). Various openings can be formed through the alternating stack (32, 42). The various openings may comprise memory openings 49 that are formed in the memory array region 100 and support openings 19 that are formed in the contact region 300. Each of the memory openings 49 and the support openings 19 can vertically extend through the alternating stack (32, 42) and into the in-process source-level material layers 110' In one embodiment, bottom surfaces of the memory openings 49 and the support openings 19 may be formed within the lower source-level semiconductor layer 112 or at an interface between the lower source-level semiconductor layer and the stopper insulating layer 106.

The support openings 19 may have a diameter in a range from 60 nm too 400 nm, such as from 120 nm to 300 nm, although lesser and greater thicknesses may be employed. The memory openings 49 may have a diameter in a range from 60 nm too 400 nm, such as from 120 nm to 300 nm, although lesser and greater thicknesses may be employed.

In one embodiment, the memory array region 100 may be laterally spaced apart from the contact region 300 along a first horizontal direction hd1. The memory openings 49 may comprise rows of memory openings 49 that are arranged along the first horizontal direction hd1 and laterally spaced apart along a second horizontal direction hd2 that is perpendicular to the first horizontal direction hd2. Multiple clusters of memory openings 49, each containing a respective two-dimensional periodic array of memory openings 49, may be formed in the memory array region 100. The clusters of memory openings 49 may be laterally spaced apart along the second horizontal direction hd2.

Generally, a plurality of normal memory blocks B_NM may be repeated along the second horizontal direction hd2, and a bit-line-bias block 102 can be formed as a single block interposed between groups of normal memory blocks B_NM.

Figure 10:
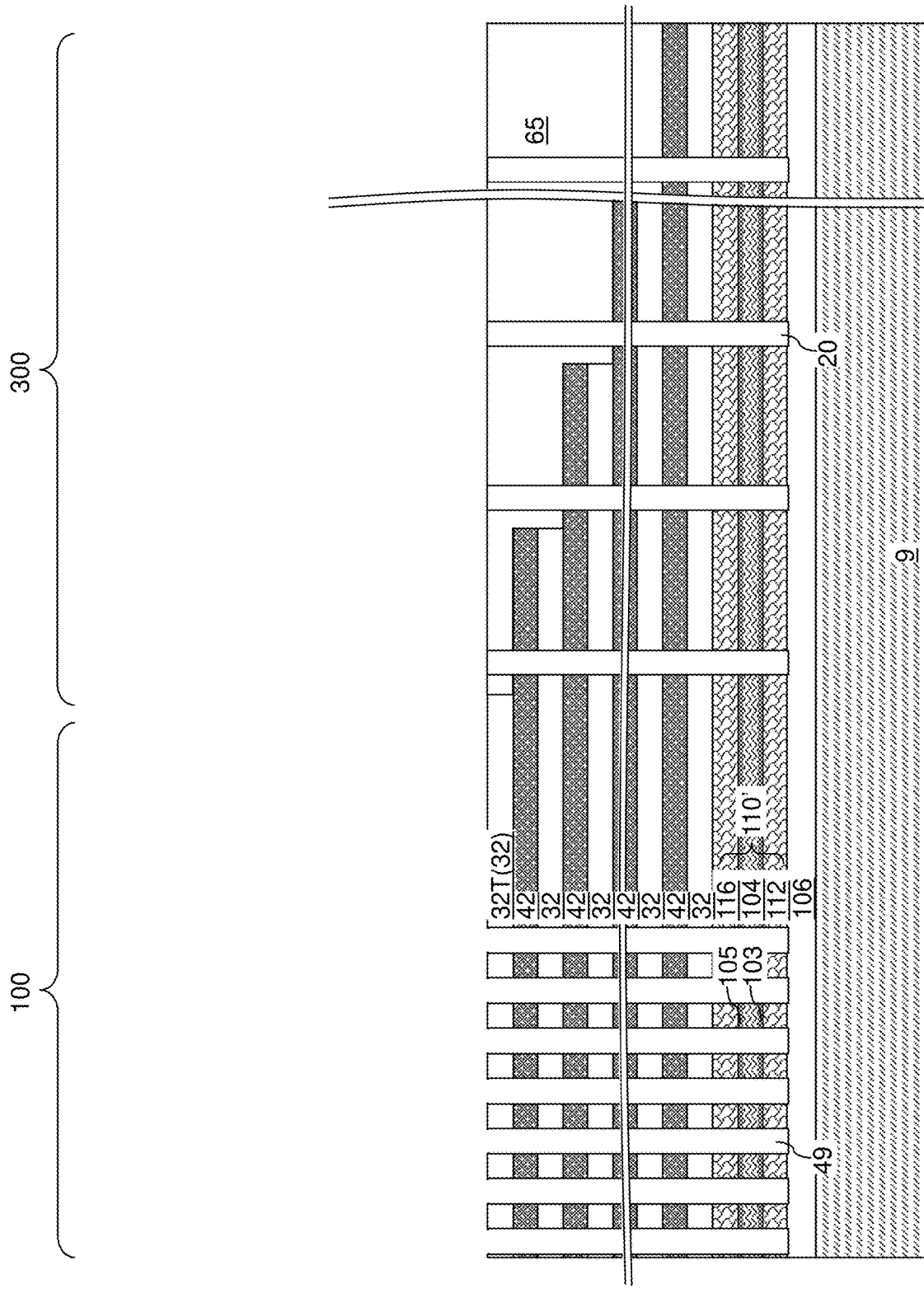
FIG. 10 is a schematic vertical cross-sectional view of the exemplary structure after formation of support pillar structures according to an embodiment of the present disclosure.

Referring to FIG. 10, an optional etch stop liner (not shown) and a sacrificial fill material (not shown) can be deposited in the memory openings 49 and the support openings. The optional etch stop liner (if present) comprises a thin dielectric material layer comprising silicon oxide, silicon nitride, or a dielectric metal oxide and having a thickness in a range from 1 nm to 6 nm. The sacrificial fill material may comprise a carbon-based material (such as amorphous carbon or diamond-like carbon), a semiconductor material (such as amorphous silicon or polysilicon), a dielectric fill material (such as borosilicate glass or organosilicate glass), or a polymer material. Excess portions of the sacrificial fill material can be removed from above the horizontal plane including the topmost layer of the alternating stack (32, 42) by a planarization process such as an etch back process. Remaining portions of the sacrificial fill material that fill the memory openings 49 and the support openings 19 constitute sacrificial memory opening fill structures (not shown) and sacrificial support opening fill structures (not shown).

A photoresist layer (not shown) can be applied over the alternating stack (32, 42) and the retro-stepped dielectric material portion 65, and can be lithographically patterned to cover the memory array region 100 without covering the contact region 300. The sacrificial support opening fill structures and portions of the optional etch stop liner in the contact region 300 can be removed selective to the materials of the retro-stepped dielectric material portion 65 and the alternating stack (32, 42). For example, an etch process or an ashing process may be employed to remove the sacrificial support opening fill structures and portions of the optional etch stop liner in the contact region 300. The photoresist layer can be subsequently removed.

A dielectric fill material such as silicon oxide can be deposited in the support openings 19 by a conformal deposition process. Excess portions of the dielectric fill material can be removed from above the top surface of the topmost insulating layer 32T, for example, by a recess etch process. Each portion of the dielectric fill material that fills a respective support opening 19 constitutes a support pillar structure 20, which can be employed to provide structural support to the insulating layers 32 and the retro-stepped dielectric material portion 65 during replacement of the sacrificial material layers 42 with electrically conductive layers.

Subsequently, the sacrificial memory opening fill structures and portions of the optional etch stop liner in the memory array region 100 can be removed selective to the materials of the retro-stepped dielectric material portion 65 and the alternating stack (32, 42). For example, an etch process or an ashing process may be employed to remove the sacrificial memory opening fill structures and portions of the optional etch stop liner in the memory array region 100. Voids are formed in the volumes of the memory openings 19.

FIGS. 11A-11D are sequential vertical cross-sectional views of a memory opening 49 during formation of a NAND string (e.g., a dummy NAND string or a data storage NAND string) which is referred to below as a "memory opening fill structure" 58 according to an embodiment of the present disclosure.

Figure 11B:
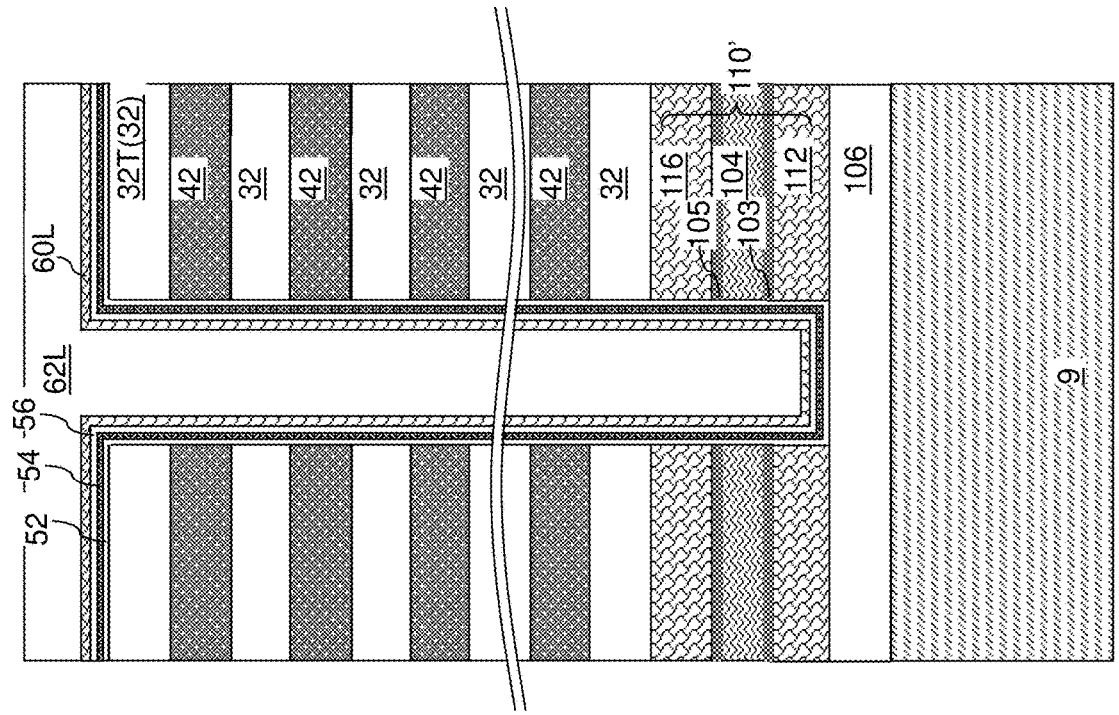
FIGS. 11A-11D are sequential vertical cross-sectional views of a memory opening during formation of a memory opening fill structure according to an embodiments of the present disclosure.
Figure 11A:
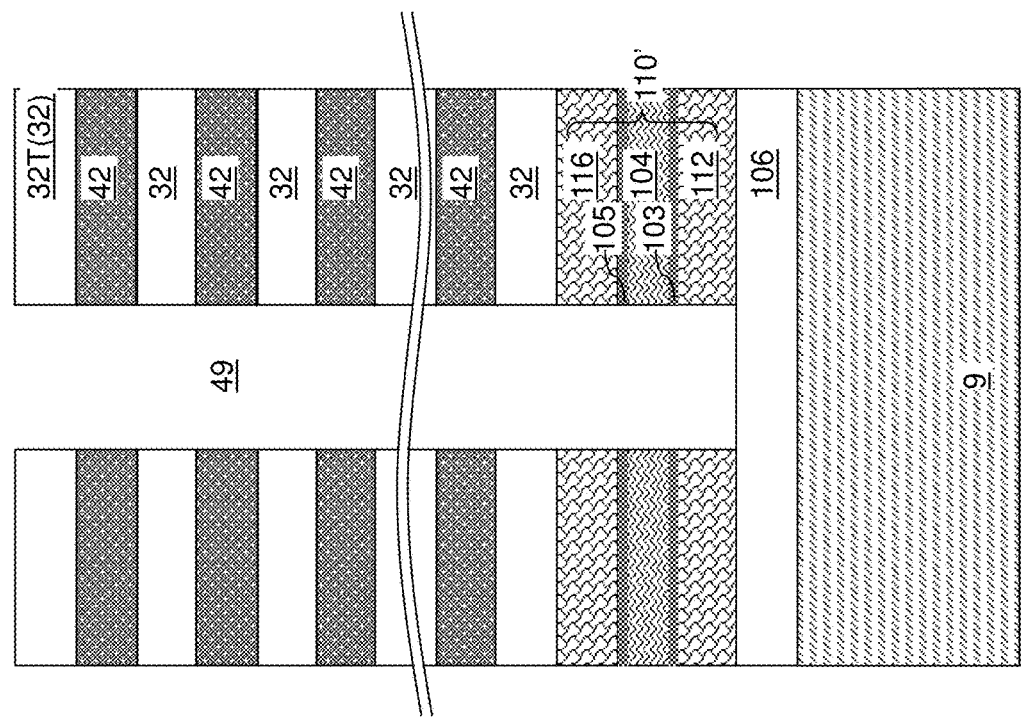

Referring to FIG. 11A, a memory opening 49 is illustrated after the processing steps of FIG. 10.

Referring to FIG. 11B, a layer stack including a memory material layer 54 can be conformally deposited. In an illustrative example, the layer stack may comprise an optional blocking dielectric layer 52, the memory material layer 54, and an optional dielectric liner 56. The memory material layer 54 includes a memory material, i.e., a material that can store data bits therein. The memory material layer 54 may comprise a charge storage material (such as silicon nitride), a ferroelectric material, a phase change memory material, or any other memory material that can store data bits by inducing a change in the electrical resistivity, ferroelectric polarization, or any other measurable physical property. In case the memory material layer 54 comprise a charge storage material, the optional dielectric liner 56 may comprise a tunneling dielectric layer.

A semiconductor channel material layer 60L can be deposited over the layer stack (52, 54, 56) by performing a conformal deposition process. If the semiconductor channel material layer 60L is doped, the semiconductor channel material layer 60L may have a doping of a first conductivity type, which may be p-type or n-type. In one embodiment, the first semiconductor material comprises a first doped silicon material having a doping of the first conductivity type. In an illustrative example, the atomic concentration of dopants of the first conductivity type in the semiconductor channel material layer 60L may be in a range from $1.0 \times 10^{13}/cm^3$ to $3.0 \times 10^{17}/cm^3$, such as $1.0 \times 10^{14}/cm^3$ to $3.0 \times 10^{16}/cm^3$, although lesser and greater atomic concentrations may also be employed. A dielectric core layer 62L comprising a dielectric fill material can be deposited in remaining volumes of the memory openings 49 and over the alternating stack (32, 42).

Figure 11D:
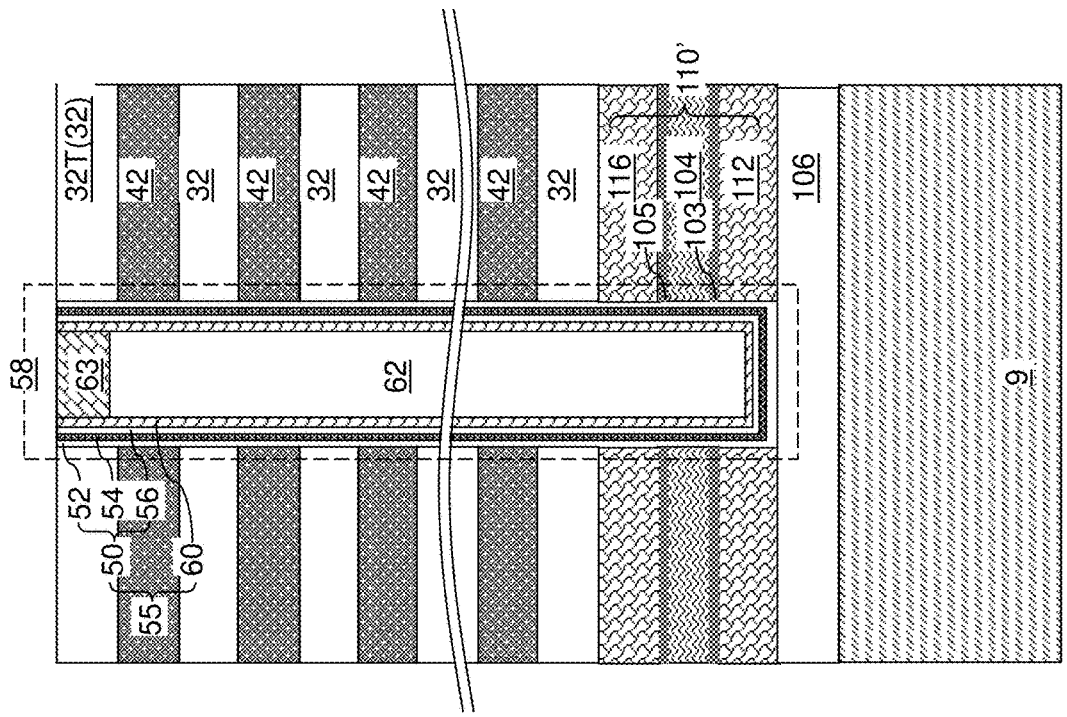
Figure 11C:
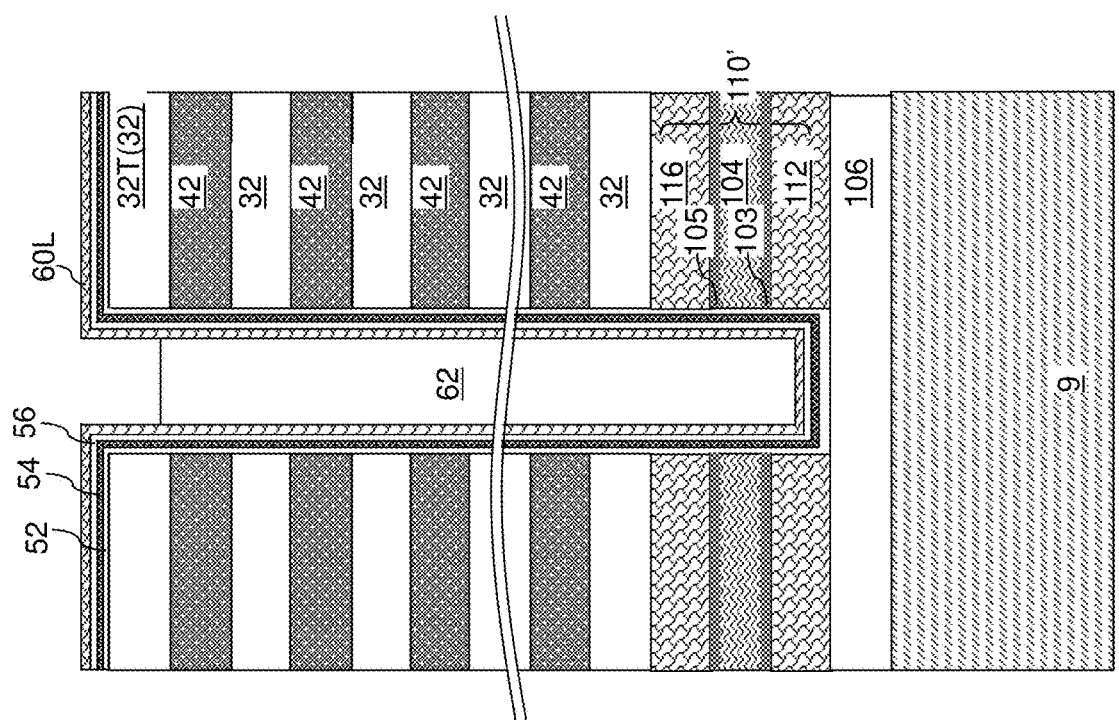

Referring to FIG. 11C, the dielectric core layer 62L can be vertically recessed such that each remaining portion of the dielectric core layer 62L has a top surface at, or about, the horizontal plane including the bottom surface of the topmost insulating layers 32T. Each remaining portion of the dielectric core layer 62L constitutes a dielectric core 62.

Referring to FIG. 11D, a doped semiconductor material having a doping of a second conductivity type can be deposited within each recessed region above the dielectric cores 62. The second conductivity type is the opposite of the first conductivity type. For example, if the first conductivity type is p-type, the second conductivity type is n-type, and vice versa. The dopant concentration in the deposited semiconductor material can be in a range from $5.0 \times 10^{18}/cm^3$ to $2.0 \times 10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the topmost insulating layer 32T, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60.

Each portion of the layer stack including the memory material layer 54 that remains in a respective memory opening 49 constitutes a memory film 50. In one embodiment, a memory film 50 may comprise an optional blocking dielectric layer 52, a memory material layer 54, and an optional dielectric liner 56. Each contiguous combination of a memory film 50 and a vertical semiconductor channel 60 constitutes a memory stack structure 55. Each combination of a memory stack structure 55, a dielectric core 62, and a drain region 63 within a memory opening 49 constitutes a memory opening fill structure 58. Each memory opening fill structure 58 comprises a respective vertical stack of memory elements, which may comprise portions of the memory material layer 54 located at levels of the sacrificial material layers 42, or generally speaking, at levels of spacer material layers that may be formed as, or may be subsequently replaced at least partly with, electrically conductive layers.

Figure 12A:
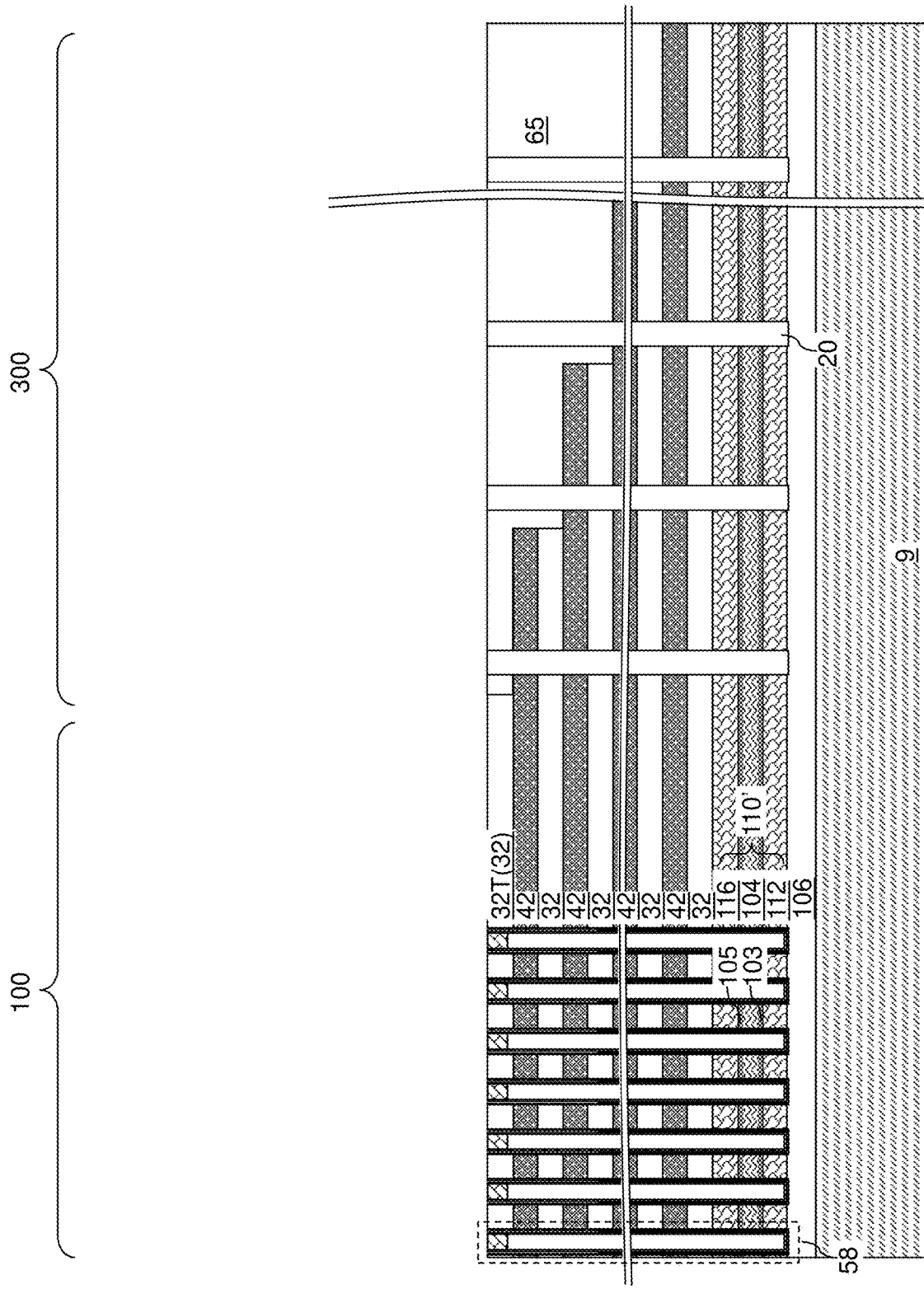
FIG. 12A is a vertical cross-sectional view of the exemplary structure after formation of memory opening fill structures according to an embodiment of the present disclosure.
Figure 12B:
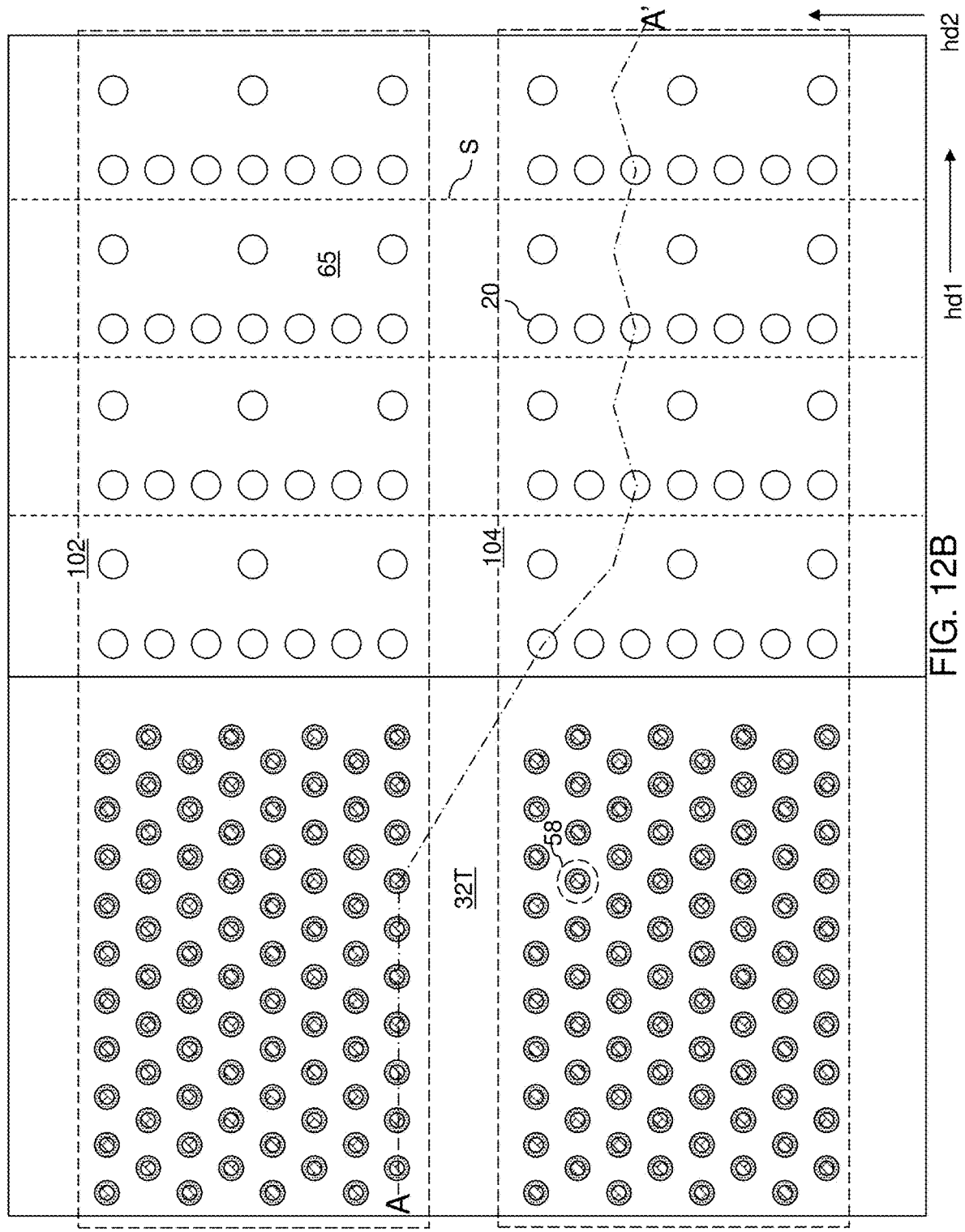
FIG. 12B is a top-down view of the exemplary structure of FIG. 12A. The vertical plane A-A' is the cut plane of the vertical cross-sectional view of FIG. 12A.

Referring to FIGS. 12A and 12B, the exemplary structure is illustrated after formation of memory opening fill structures 58 within the memory openings 49. Each of the memory opening fill structures 58 may comprise a memory film 50 and a vertical semiconductor channel 60.

Figure 13A:
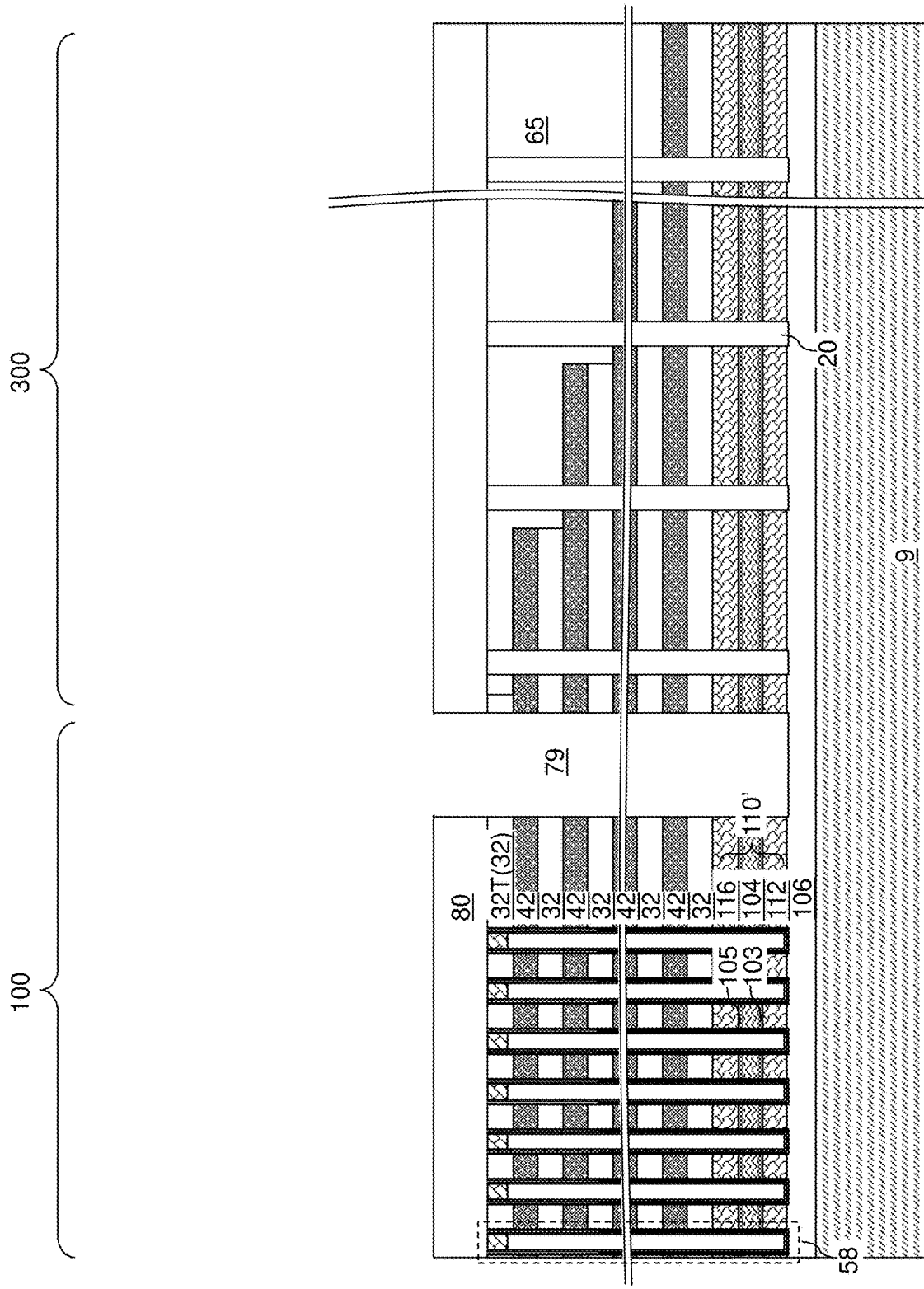
FIG. 13A is a vertical cross-sectional view of the exemplary structure after formation of isolation trenches according to an embodiment of the present disclosure.
Figure 13B:
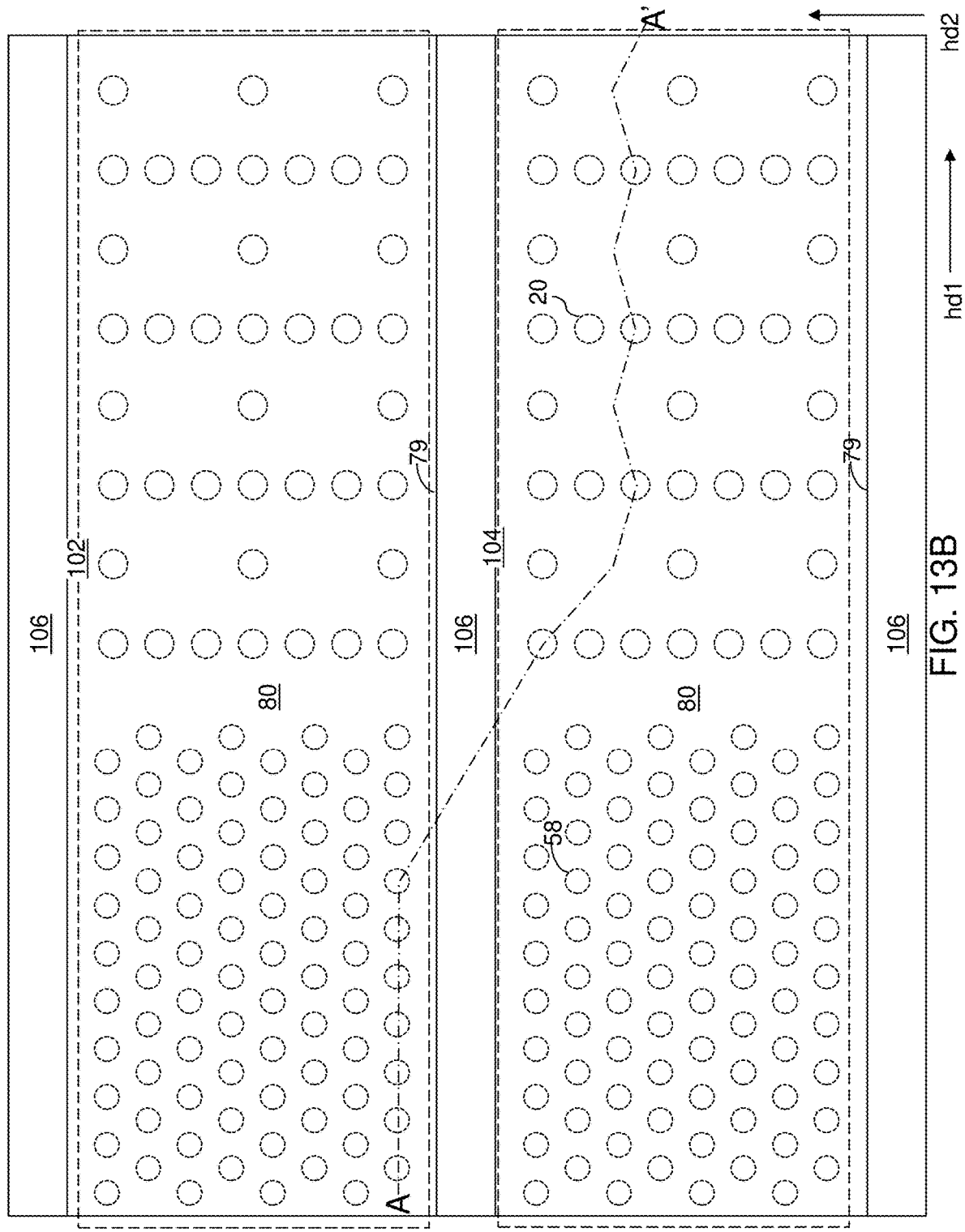
FIG. 13B is a top-down view of the exemplary structure of FIG. 13A. The vertical plane A-A' is the cut plane of the vertical cross-sectional view of FIG. 13A.

Referring to FIGS. 13A and 13B, a dielectric material such as undoped silicate glass or a doped silicate glass can be deposited over the alternating stack (32, 42) to form a contact-level dielectric layer 80. The thickness of the contact-level dielectric layer 80 may be in a range from 100 nm to 600 nm, such as from 200 nm to 400 nm, although lesser and greater thicknesses may also be employed.

A photoresist layer (not shown) can be applied over the contact-level dielectric layer 80, and can be lithographically patterned to form elongated openings that laterally extend along the first horizontal direction hd1 between neighboring clusters of memory opening fill structures 58. An anisotropic etch process can be performed to transfer the pattern of the openings in the photoresist layer through the contact-level dielectric layer 80, the alternating stack (32, 42), the stepped dielectric material portion 65, and the in-process source-level material layers 110'. Lateral isolation trenches 79 laterally extending along the first horizontal direction hd1 can be formed through the alternating stack (32, 42), the stepped dielectric material portion 65, the contact-level dielectric layer 80, and the in-process source-level material layers 110'. Each of the lateral isolation trenches 79 may comprise a respective pair of lengthwise sidewalls that are parallel to the first horizontal direction hd1 and vertically extend from the stopper insulating layer 106 to the top surface of the contact-level dielectric layer 80. A top surface of the stopper insulating layer 106 can be physically exposed underneath each lateral isolation trench 79. The lateral isolation trenches 79 isolate adjacent blocks (e.g., 102 and/or 104) from each other along the second horizontal (i.e., bit line) direction hd2. Thus, the area between two adjacent isolation trenches 70 corresponds to a block (e.g., a data storage memory block 104 or a BLBIAS block 102). The photoresist layer can be subsequently removed, for example, by ashing.

Figure 14:
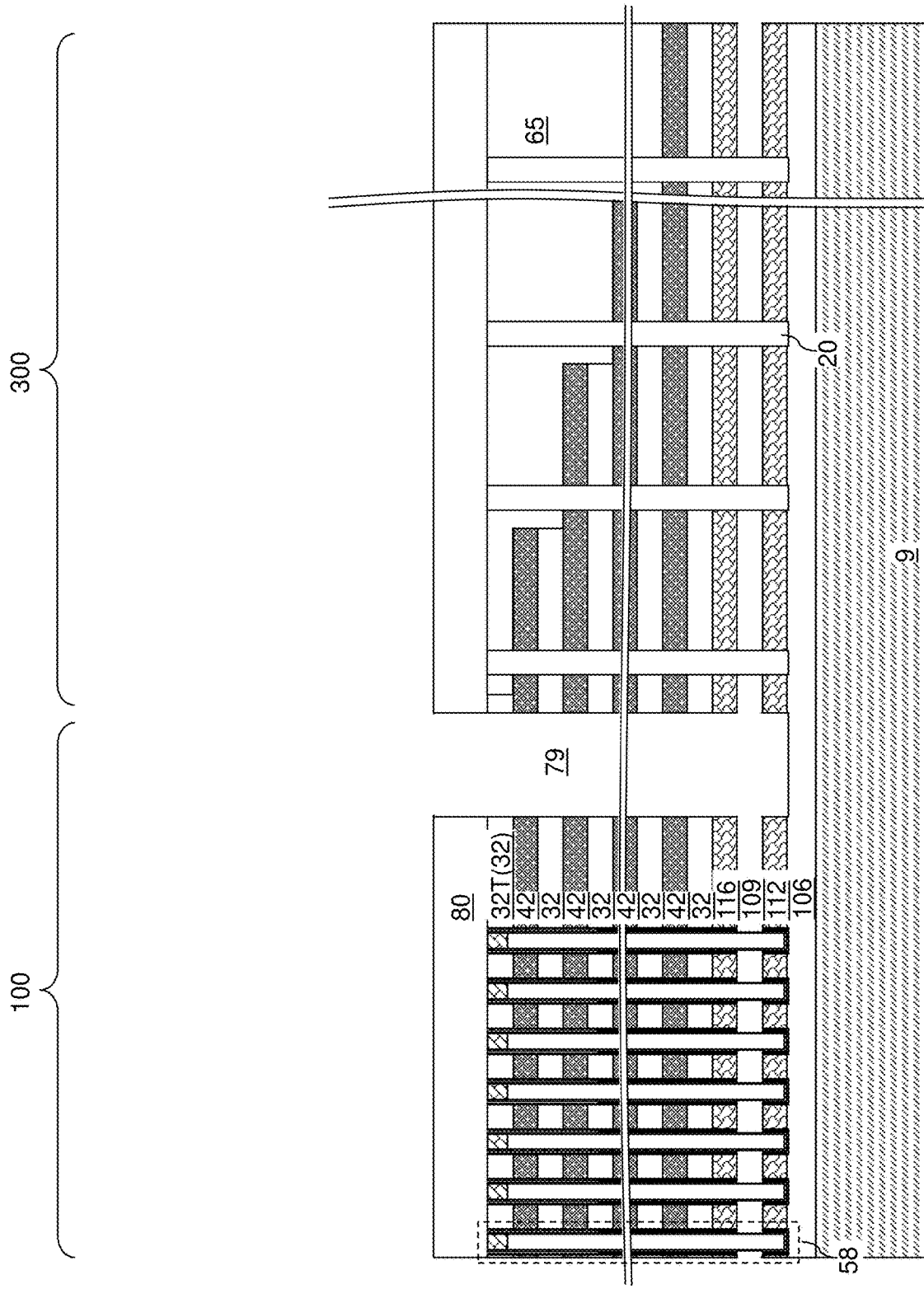
FIG. 14 is a vertical cross-sectional view of the exemplary structure after formation of a source-level cavity according to an embodiment of the present disclosure.

Referring to FIG. 14, an etchant that etches the material of the source-level sacrificial layer 104 selective to the materials of the alternating stack (32, 42), the contact level dielectric layer 80, the stepped dielectric material portion 65, the lower source-level semiconductor layer 112, the upper source-level semiconductor layer 116, the upper sacrificial liner 105 (if present), and the lower sacrificial liner 103 (if present) may be introduced into the lateral isolation trenches 79 by performing an isotropic etch process. For example, if the source-level sacrificial layer 104 includes undoped amorphous silicon or a silicon-germanium alloy, a wet etch process using hot trimethyl-2 hydroxyethyl ammonium hydroxide ("hot TMY") or tetramethyl ammonium hydroxide (TMAH) may be used to remove the source-level sacrificial layer 104 selective to the alternating stack (32, 42), the contact level dielectric layer 80, the stepped dielectric material portion 65, the lower source-level semiconductor layer 112, and the upper source-level semiconductor layer 116. A source cavity 109 is formed in the volume from which the source-level sacrificial layer 104 is removed.

Wet etch chemicals such as hot TMY and TMAH are selective to doped semiconductor materials such as the p-doped semiconductor material and/or the n-doped semiconductor material of the upper source-level semiconductor layer 116 and the lower source-level semiconductor layer 112. Thus, use of selective wet etch chemicals such as hot TMY and TMAH for the wet etch process that forms the source cavity 109 provides a large process window against etch depth variation during formation of the lateral isolation trenches 79. Specifically, even if sidewalls of the upper source-level semiconductor layer 116 are physically exposed or even if a surface of the lower source-level semiconductor layer 112 is physically exposed upon formation of the source cavity 109, collateral etching of the upper source-level semiconductor layer 116 and/or the lower source-level semiconductor layer 112 is minimal, and the structural change to the exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 is physically exposed to the source cavity 109. Specifically, each of the memory opening fill structures 58 includes a sidewall and that are physically exposed to the source cavity 109.

A sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper sacrificial liner 105 (if present) and the lower sacrificial liner 103 (if present) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners. A top surface of the lower source-level semiconductor layer 112 and a bottom surface of the upper source-level semiconductor layer 116 may be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Figure 15:
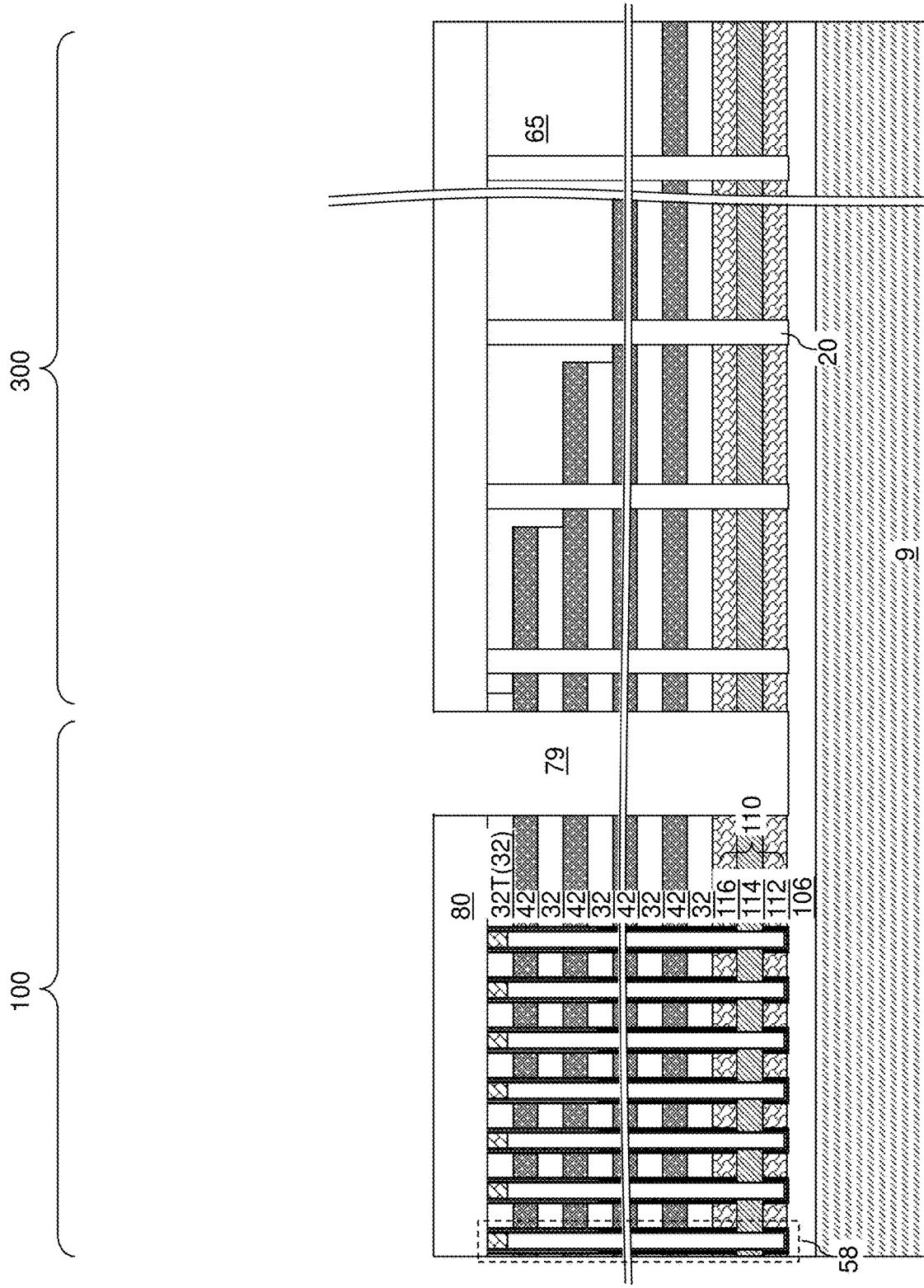
FIG. 15 is a vertical cross-sectional view of the exemplary structure after formation of a source contact layer according to an embodiment of the present disclosure.

Referring to FIG. 15, a semiconductor material having a doping of the second conductivity type may be deposited on the physically exposed semiconductor surfaces around the source cavity 109. The physically exposed semiconductor surfaces include bottom portions of outer sidewalls of the vertical semiconductor channels 60 and a horizontal surface of the at least one source-level semiconductor layer (such as a bottom surface of the upper source-level semiconductor layer 116 and/or a top surface of the lower source-level semiconductor layer 112). For example, the physically exposed semiconductor surfaces may include the bottom portions of outer sidewalls of the vertical semiconductor channels 60, the top horizontal surface of the lower source-level semiconductor layer 112, and the bottom surface of the upper source-level semiconductor layer 116.

In one embodiment, the doped semiconductor material of the second conductivity type may be deposited on the physically exposed semiconductor surfaces around the source cavity 109 by a selective semiconductor deposition process. A semiconductor precursor gas, an etchant, and a dopant gas may be flowed concurrently into a process chamber including the exemplary structure during the selective semiconductor deposition process. For example, the semiconductor precursor gas may include silane, disilane, or dichlorosilane, the etchant gas may include gaseous hydrogen chloride, and the dopant gas may include a hydride of a dopant atom such as phosphine, arsine, stibine, or diborane. In this case, the selective semiconductor deposition process grows a doped semiconductor material having a doping of the second conductivity type from physically exposed semiconductor surfaces around the source cavity 109. The deposited doped semiconductor material forms a source contact layer 114, which may contact sidewalls of the vertical semiconductor channels 60. The atomic concentration of the dopants of the second conductivity type in the deposited semiconductor material may be in a range from $1.0 \times 10^{20}/cm^3$ to $2.0 \times 10^{21}/cm^3$, such as from $2.0 \times 10^{20}/cm^3$ to $8.0 \times 10^{20}/cm^3$. The source contact layer 114 as initially formed may consist essentially of semiconductor atoms and dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The duration of the selective semiconductor deposition process may be selected such that the source cavity 109 is filled with the source contact layer 114. In one embodiment, the source contact layer 114 may be formed by selectively depositing a doped semiconductor material having a doping of the second conductivity type from semiconductor surfaces around the source cavity 109. In one embodiment, the doped semiconductor material may include doped polysilicon. Thus, the source-level sacrificial layer 104 may be replaced with the source contact layer 114. The layer stack including the lower source-level semiconductor layer 112, the source contact layer 114, and the upper source-level semiconductor layer 116 constitutes a source layer 110, which replaces the in-process source-level material layers 110'. The source layer 110 contacts an end portion of each of the vertical semiconductor channels 60.

Figure 16:
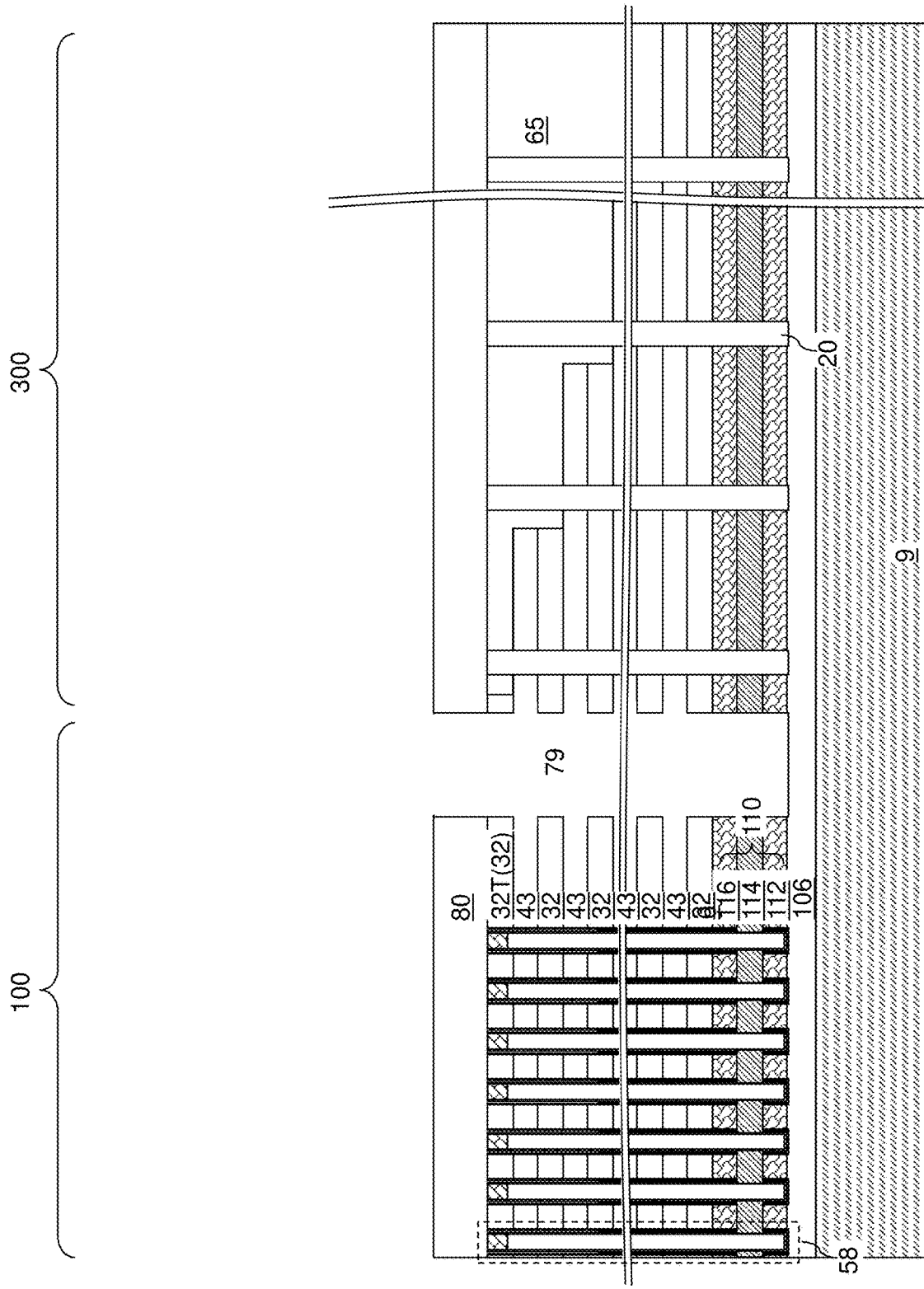
FIG. 16 is a vertical cross-sectional view of the exemplary structure after formation of laterally-extending cavities according to an embodiment of the present disclosure.

Referring to FIG. 16, an isotropic etch process can be performed to remove the sacrificial material layers 42 selective to the insulating layers 32, the stopper insulating layer 106, the memory opening fill structures 58, the sacrificial etch stop liners 71, and the source layer 110. Laterally-extending cavities 43 can be formed in volumes from which the sacrificial material layers 42 are removed. Sidewall surface segments of the memory opening fill structures 58 can be physically exposed to the laterally-extending cavities 43. In an illustrative example, if the sacrificial material layers 42 comprise silicon oxide, the isotropic etch process may comprise a wet etch process employing hot phosphoric acid, which is a process in which the exemplary structure is immersed in phosphoric acid at, or near, the boiling point of the phosphoric acid. A suitable clean process may be performed as needed.

Figure 17:
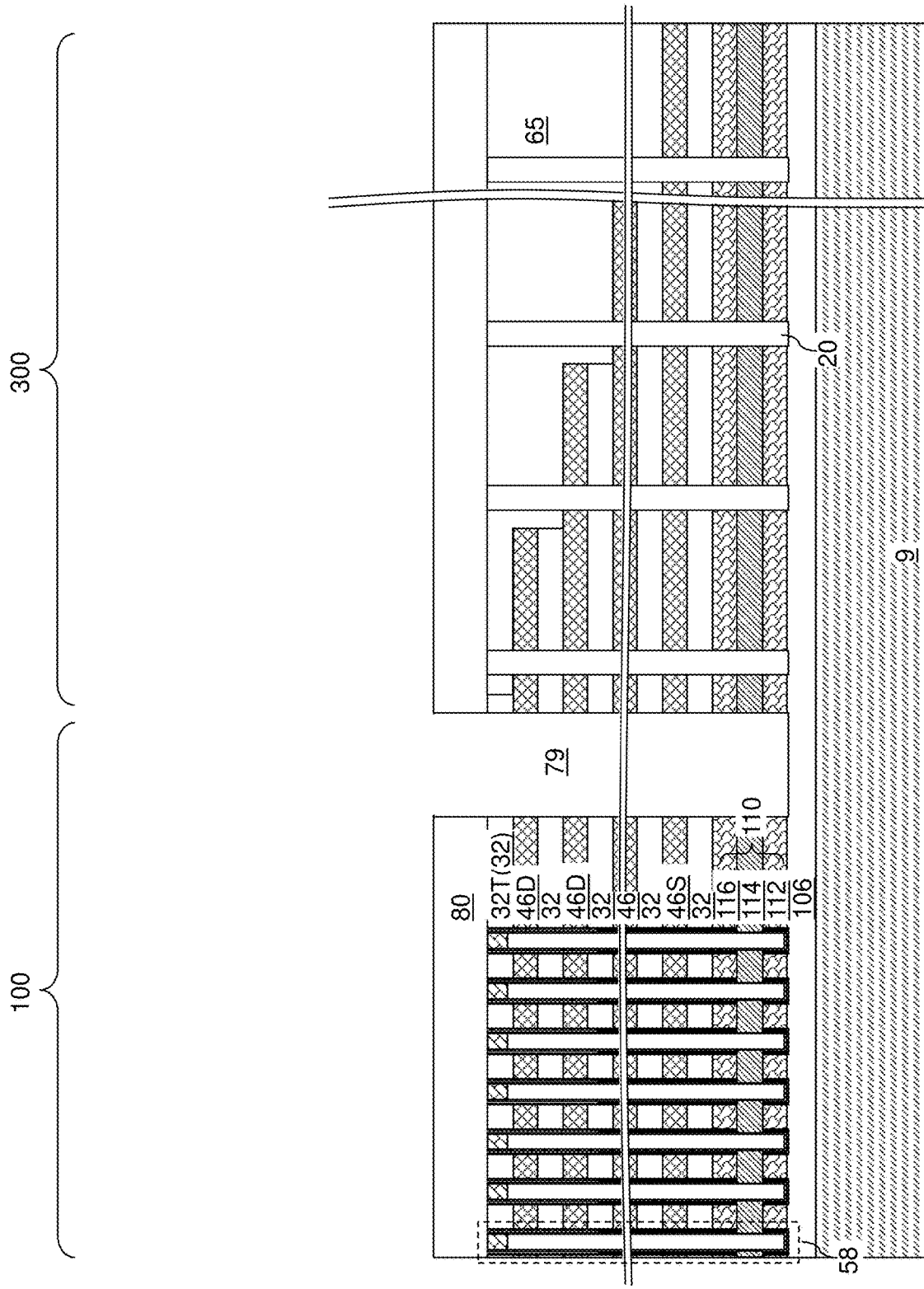
FIG. 17 is a vertical cross-sectional view of the exemplary structure after formation of electrically conductive layers according to an embodiment of the present disclosure.

Referring to FIG. 17, a backside blocking dielectric layer (not shown) can be optionally formed in the laterally-extending cavities 43 by a conformal deposition process. At least one conductive material, such as at least one metallic material, can be conformally deposited in the laterally-extending cavities 43. The at least one conductive material may comprise, for example, a combination of a metallic barrier material and a metallic fill material. The metallic barrier material may comprise, for example, TiN, TaN, WN, MON, TiC, TaC, WC, or a combination thereof. The metallic fill material may comprise, for example, Ti, Ta, Mo, Co, Ru, W, Cu, other transition metals, and/or alloys or layer stacks thereof. Excess portions of the at least one conductive material that are deposited in the lateral isolation trenches 79 or above the contact-level dielectric layer 80 can be removed by performing an etch-back process, which may comprise an isotropic etch process and/or an anisotropic etch process. Each remaining portion of the at least one conductive material filling a respective one of the laterally-extending cavities 43 constitutes an electrically conductive layer 46. An alternating stack of insulating layers 32 and electrically conductive layers 46 can be formed between each neighboring pair of lateral isolation trenches 79 over the carrier substrate 9. A plurality of alternating stacks of insulating layers 32 and electrically conductive layers 46 can be laterally spaced apart among one another by the lateral isolation trenches 79. The electrically conductive layers 46 include the word lines and the select gate electrodes (46D, 46S).

Figure 18A:
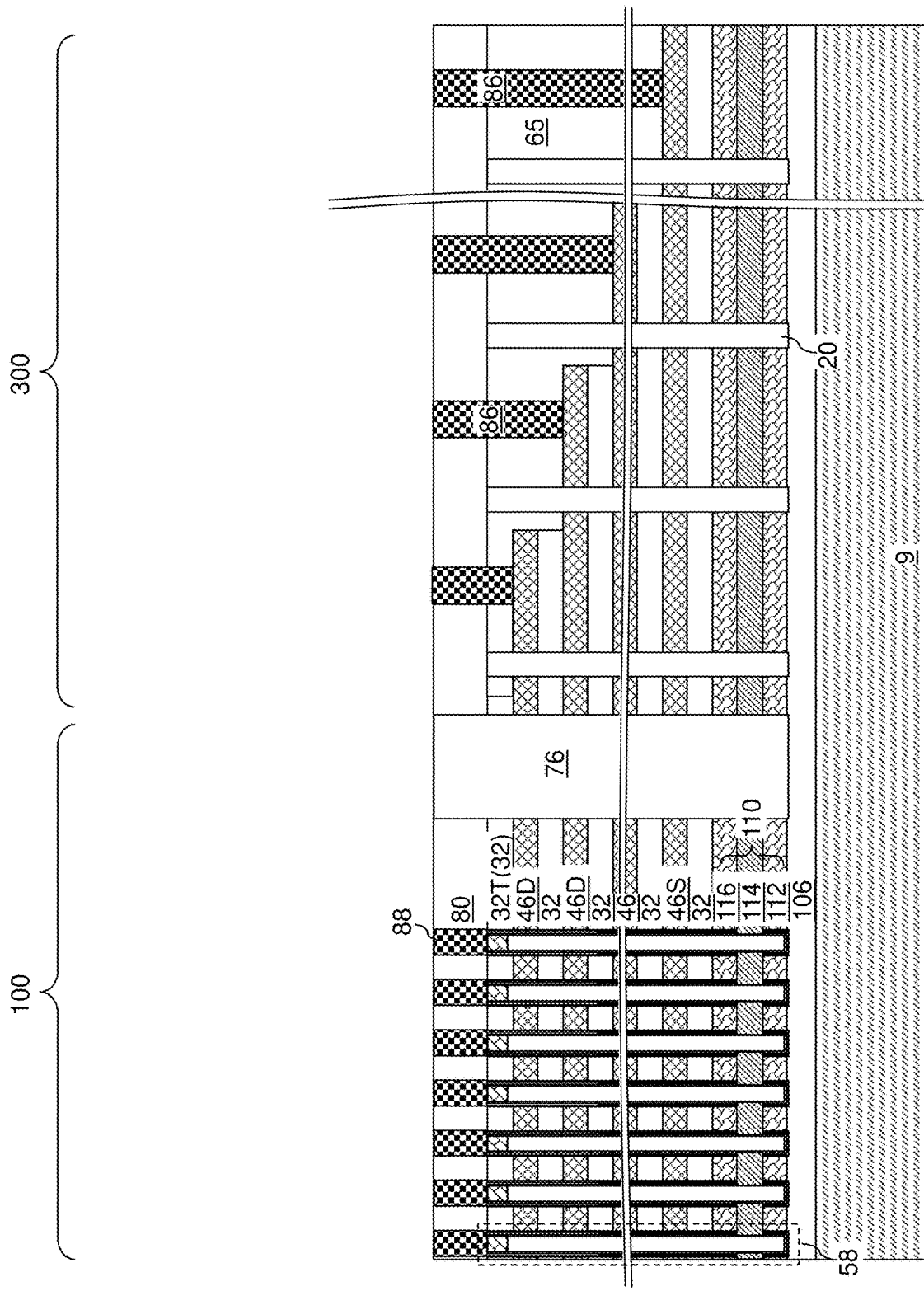
FIG. 18A is a vertical cross-sectional view of the exemplary structure after formation of lateral isolation trench fill structures and contact via structures according to an embodiment of the present disclosure.

Referring to FIGS. 18A and 18B, an insulating fill material may be conformally deposited in the lateral isolation trenches 79. Excess portions of the insulating fill material may be removed from above the contact-level dielectric layer 80, for example, by a recess etch process. Each remaining portion of the insulating fill material that fills a respective lateral isolation trench 79 constitutes an isolation trench fill structure 76. Alternatively, each isolation trench fill structure 76 may comprise a combination of a tubular insulating spacer (not expressly shown) and a conductive connection via structure (not expressly shown) that is laterally surrounded by the tubular insulating spacer.

A photoresist layer (not shown) can be applied over the contact-level dielectric layer 80, and can be lithographically patterned to form openings over each of the memory opening fill structures 58 over the horizontally-extending surfaces of the stepped surfaces in the contact region. An anisotropic etch process can be performed to transfer the pattern of the openings in the photoresist layer through the contact-level dielectric layer 80 and the retro-stepped dielectric material portion 65. Drain contact via cavities can be formed through the contact-level dielectric layer 80 over the memory opening fill structures 58. Layer contact via structures can be formed through the contact-level dielectric layer 80 and the retro-stepped dielectric material portion 65 on a top surface of a respective one of the electrically conductive layers 46. The photoresist layer can be subsequently removed, for example, by ashing.

At least one conductive material, such as a combination of a metallic barrier material and a metallic fill material, can be deposited in the drain contact via cavities and the layer contact via cavities. Excess portions of the at least one conductive material can be removed from above the horizontal plane including the top surface of the contact-level dielectric layer 80 by a planarization process, which may employ a recess etch process and/or a chemical mechanical polishing process. Remaining portions of the at least one conductive material that fill the drain contact via cavities constitute drain contact via structures 88 contacting a top surface of a respective one of the drain regions 63. Remaining portions of the at least one conductive material that fill the layer contact via cavities constitute layer contact via structures 86 contacting a top surface of a respective one of the electrically conductive layers 46.

Figure 19A:
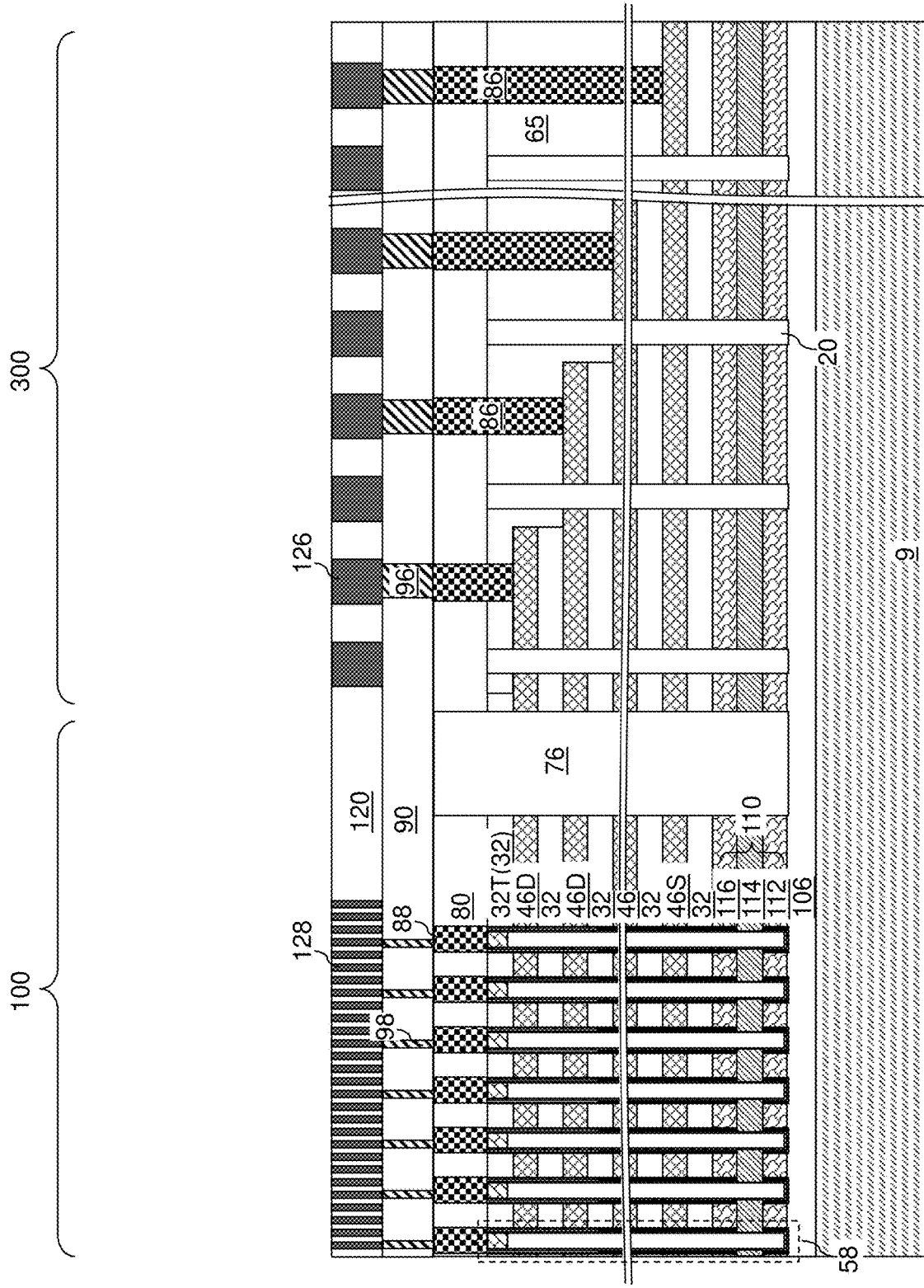
FIG. 19A is a vertical cross-sectional view of the exemplary structure after formation of bit lines and bit-line-level metal lines according to an embodiment of the present disclosure.
Figure 19B:
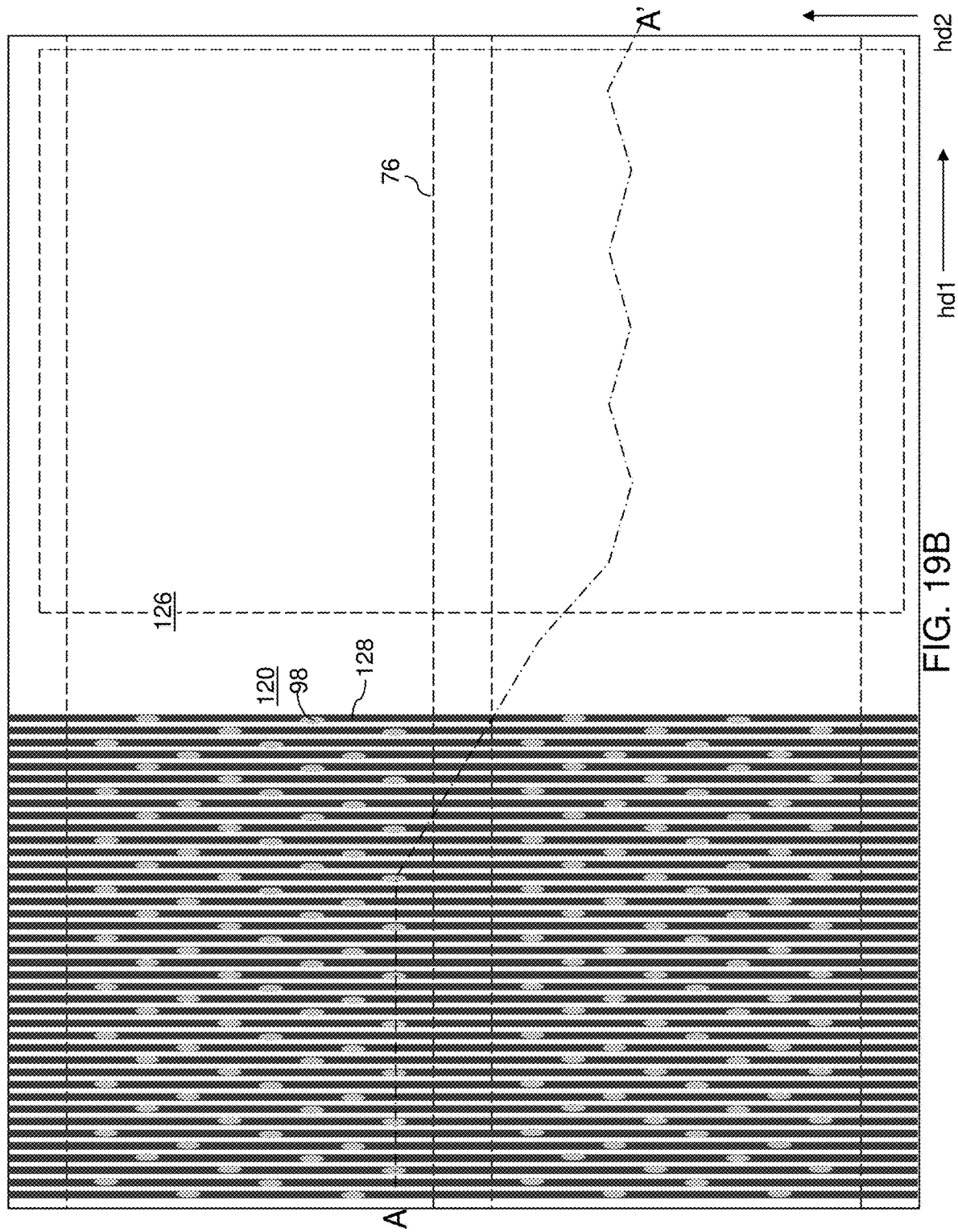
FIG. 19B is a top-down view of the exemplary structure of FIG. 19A. The vertical plane A-A' is the cut plane of the vertical cross-sectional view of FIG. 19A.

Referring to FIGS. 19A and 19B, a connection-level dielectric layer 90 can be formed above the contact-level dielectric layer 80. Connection via cavities can be formed through the connection-level dielectric layer 90, and can be filled with at least one conductive material (which may comprise at least one metallic material) to form connection-level via structures (98, 96). The connection-level via structures (98, 96) comprise drain connection via structures 98 that contact a respective one of the drain contact via structures 88, and layer connection via structures 96 that contact a respective one of the layer contact via structures 86.

A bit-line-level dielectric layer 120 can be formed above the connection-level dielectric layer 90. Bit-line-level line cavities can be formed through the bit-line-level dielectric layer 120, and can be filled with at least one conductive material (which may comprise at least one metallic material) to form bit-line-level metal lines (128, 126). The bit-line-level metal lines may comprise bit lines 128 that laterally extend along the second horizontal direction hd2, and bit-line-level interconnect metal lines 126 (not individually shown) that can be employed to provide electrical connection to the layer connection via structures 96.

Figure 20:
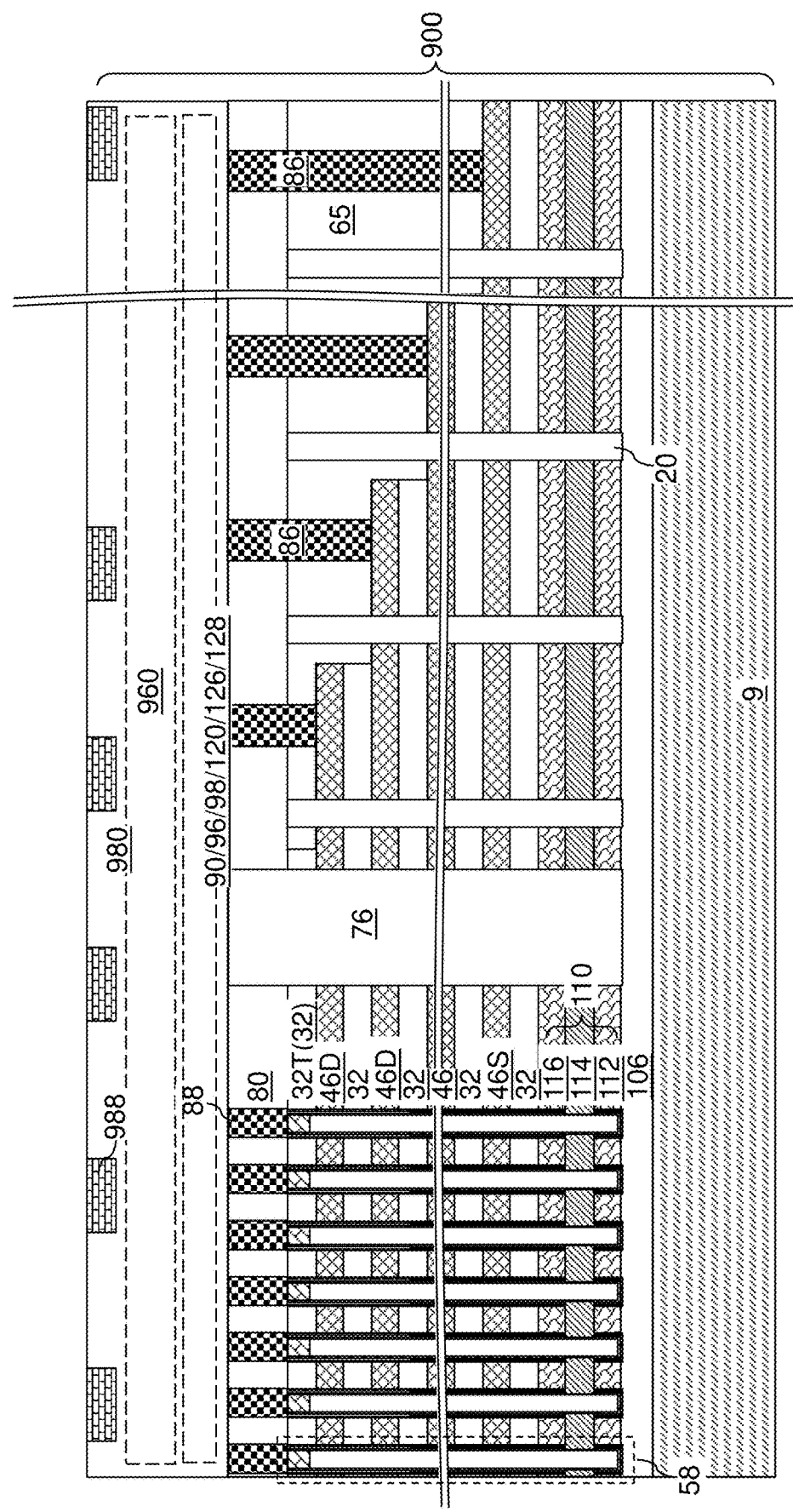
FIG. 20 is a vertical cross-sectional view of the exemplary structure after formation of a memory die according to an embodiment of the present disclosure.

Referring to FIG. 20, additional dielectric material layers and additional metal interconnect structures can be formed over the contact-level dielectric layer 80. The additional dielectric material layers may include at least one via-level dielectric layer, at least one additional line-level dielectric layer, and/or at least one additional line-and-via-level dielectric layer. The additional metal interconnect structures may comprise metal via structures, metal line structures, and/or integrated metal line-and-via structures. The additional dielectric material layers that are formed above the contact-level dielectric layer 80 are herein referred to as memory-side dielectric material layers 960. The additional metal interconnect structures are collectively referred to as memory-side dielectric material layers 960. The memory-side dielectric material layers 960 comprise a bit-line-level dielectric material layer embedding the bit lines 128, which are a subset of the memory-side metal interconnect structures 980.

Metal bonding pads, which are herein referred to as upper bonding pads 988, may be formed at the topmost level of the memory-side dielectric material layers 960. The upper bonding pads 988 may be electrically connected to the memory-side metal interconnect structures 980 and various nodes of the three-dimensional memory array including the alternating stacks of insulating layers 32 and electrically conductive layers 46 and the memory opening fill structures 58. A memory die 900 can thus be provided.

The memory-side dielectric material layers 960 are formed over the alternating stacks (32, 46). The memory-side metal interconnect structures 980 are embedded in the memory-side dielectric material layers 960. The memory-side bonding pads 988 can be embedded within the memory-side dielectric material layers 960, and specifically, within the topmost layer among the memory-side dielectric material layers 960. The memory-side bonding pads 988 can be electrically connected to the memory-side metal interconnect structures 980.

In one embodiment, the memory die 900 may comprise: a three-dimensional memory array comprising an alternating stack (32, 46) of insulating layers 32 and electrically conductive layers 46, a two-dimensional array of memory openings 49 vertically extending through the alternating stack (32, 46), and a two-dimensional array of memory opening fill structures 58 located in the two-dimensional array of memory openings 49 and comprising a respective vertical stack of memory elements and a respective vertical semiconductor channel 60; a two-dimensional array of drain contact via structures 88 electrically connected to a respective one of the vertical semiconductor channels 60; and a two-dimensional array of layer contact via structures 86 electrically connected to a respective one of the electrically conductive layers 46, a subset of which functions as word lines for the three-dimensional memory array.

Generally speaking, a memory die 900 is provided, which comprises a memory array, memory-side metal interconnect structures 980, and memory-side bonding pads 988 embedded within memory-side dielectric material layers 960. The memory die 900 comprises a memory device, which may comprise a three-dimensional memory array including an alternating stack of insulating layers 32 and electrically conductive layers 46, and further comprises a two-dimensional array of NAND strings (e.g., the memory opening fill structures 58) vertically extending through the alternating stack (32, 46). In one embodiment, the electrically conductive layers 46 comprise word lines of the two-dimensional array of NAND strings. In one embodiment, the memory-side metal interconnect structures 980 comprise the bit lines 128 for the two-dimensional array of NAND strings.

Figure 21:
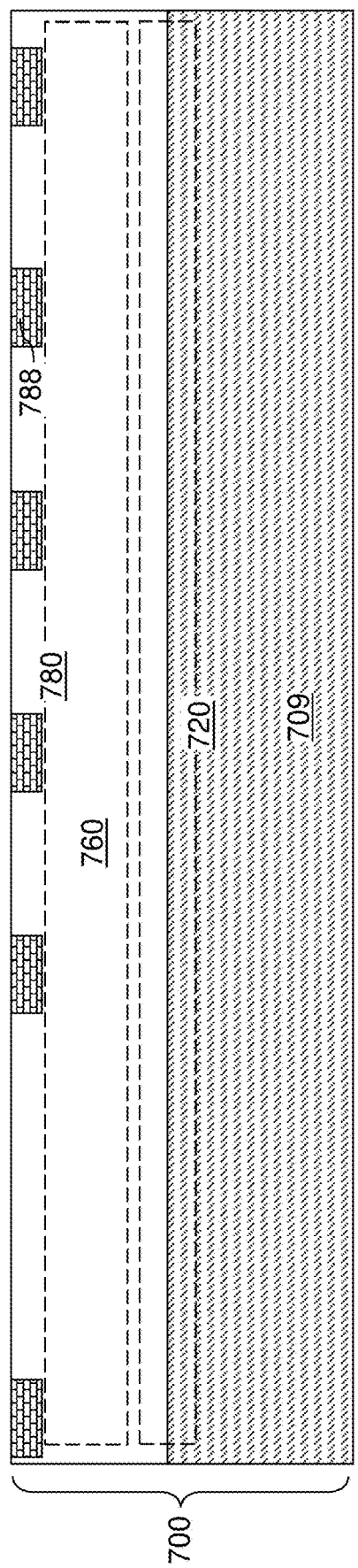
FIG. 21 is a vertical cross-sectional view of a logic die according to an embodiment of the present disclosure.

Referring to FIG. 21, a logic die 700 is provided. The logic die 700 comprises a peripheral circuit 720 that is formed on a logic-side substrate 709. According to an aspect of the present disclosure, the peripheral circuit 720 can be configured to control operation of the memory array within the memory die 900. For example, the peripheral circuit 720 may comprise word line driver regions, bit line driver regions, sense amplifier regions, input/output buffer regions, etc. Logic-side metal interconnect structures 780 embedded within logic-side dielectric material layers 760 can be formed over the peripheral circuit 720. The logic die 700 comprises logic-side bonding pads 788 embedded within logic-side dielectric material layers 760.

Figure 22:
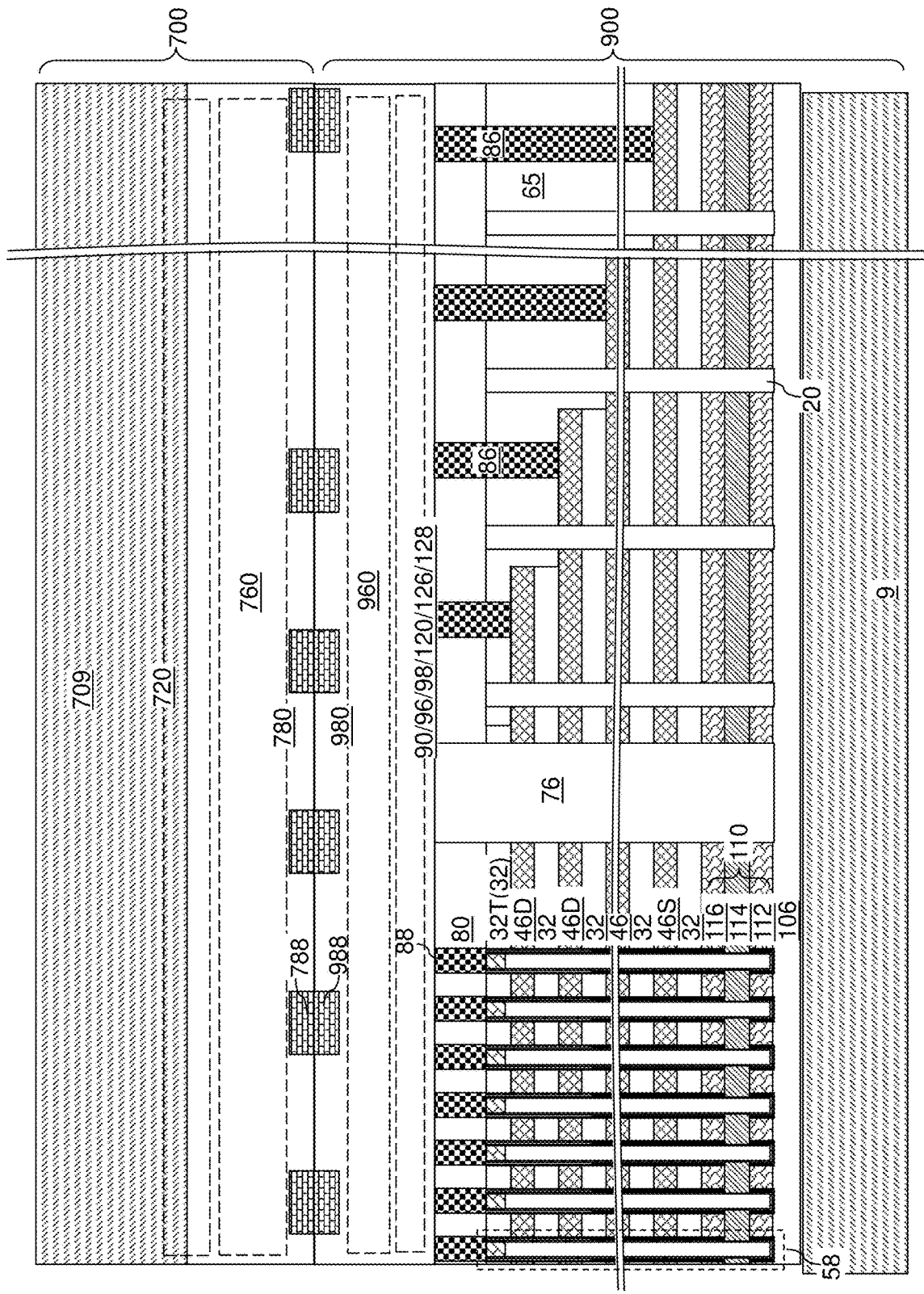
FIG. 22 is a vertical cross-sectional view of the exemplary structure after formation of a bonded assembly of the memory die and the logic die according to an embodiment of the present disclosure.

Referring to FIG. 22, a bonded assembly can be formed by bonding a logic die 700 with the memory die 900. The logic die 700 can be attached to the memory die 900, for example, by bonding the logic-side bonding pads 788 to the memory-side bonding pads 988. The bonding between the memory die 900 and the logic die 700 may be performed employing a wafer-to-wafer bonding process in which a two-dimensional array of memory dies 900 is bonded to a two-dimensional array of logic dies 700, by a die-to-bonding process, or by a die-to-die bonding process. The logic-side bonding pads 788 within each logic die 700 can be bonded to the memory-side bonding pads 988 within a respective memory die 900.

The logic die 700 can be attached to the memory die 900, for example, by bonding the logic-side bonding pads 788 to the memory-side bonding pads 988. The bonding between the memory die 900 and the logic die 700 may be performed employing a wafer-to-wafer bonding process in which a two-dimensional array of memory dies 900 is bonded to a two-dimensional array of logic dies 700, by a die-to-bonding process, or by a die-to-die bonding process. The logic-side bonding pads 788 within each logic die 700 can be bonded to the memory-side bonding pads 988 within a respective memory die 900.

Figure 23:
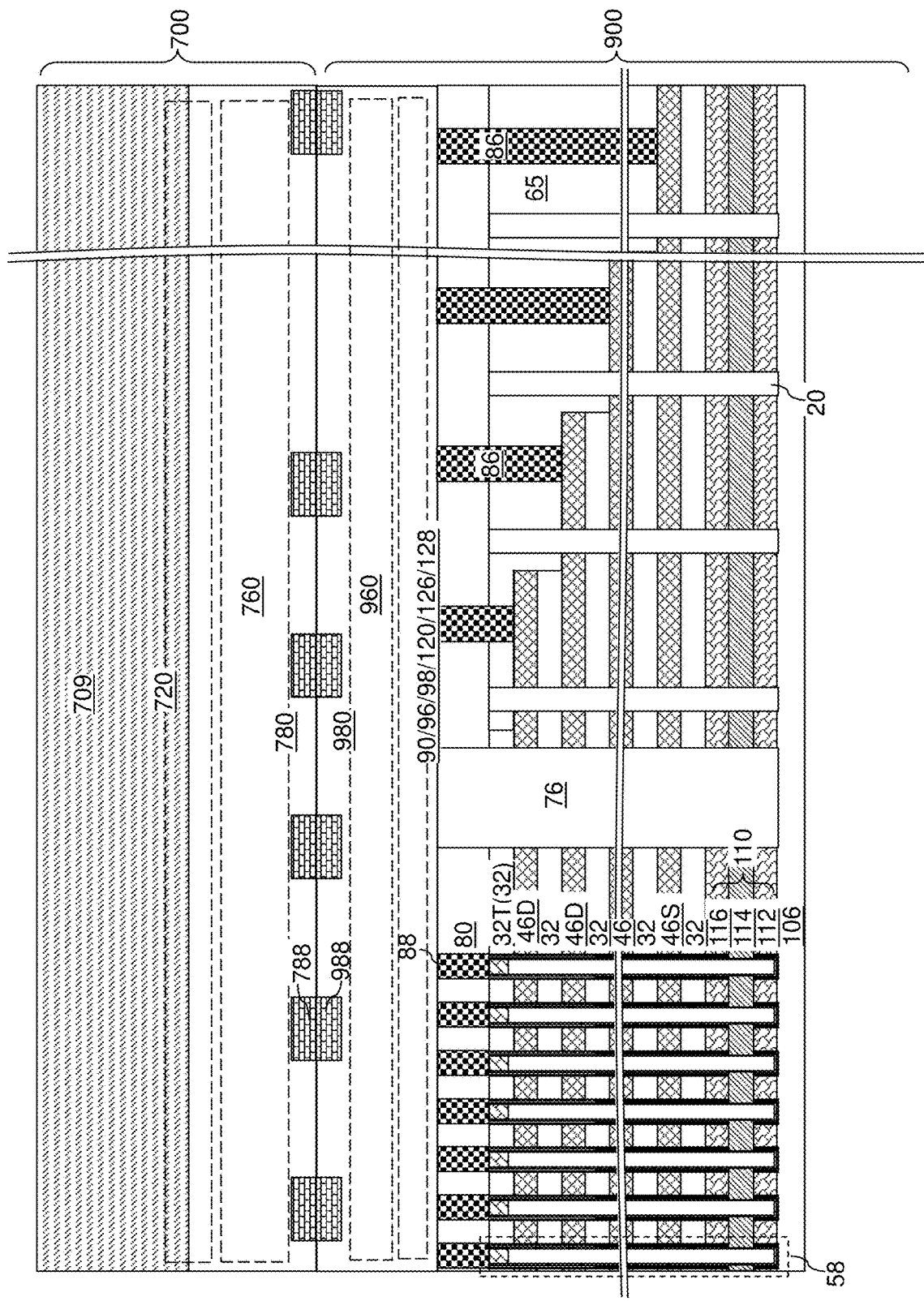
FIG. 23 is a vertical cross-sectional view of the exemplary structure after removal of a carrier substrate from the memory die according to an embodiment of the present disclosure.

Referring to FIG. 23, the carrier substrate 9 can be removed, for example, by grinding, polishing, cleaving, an isotropic etch process, and/or an anisotropic etch process. If a polishing process such as a chemical mechanical polishing process is employed to remove the carrier substrate 9, the stopper insulating layer 106 may be subsequently employed as a polishing stopper material layer. If an etch process such as a wet etch process is employed to remove the carrier substrate 9, the stopper insulating layer 106 may be subsequently employed as an etch stop material layer.

Figure 24:
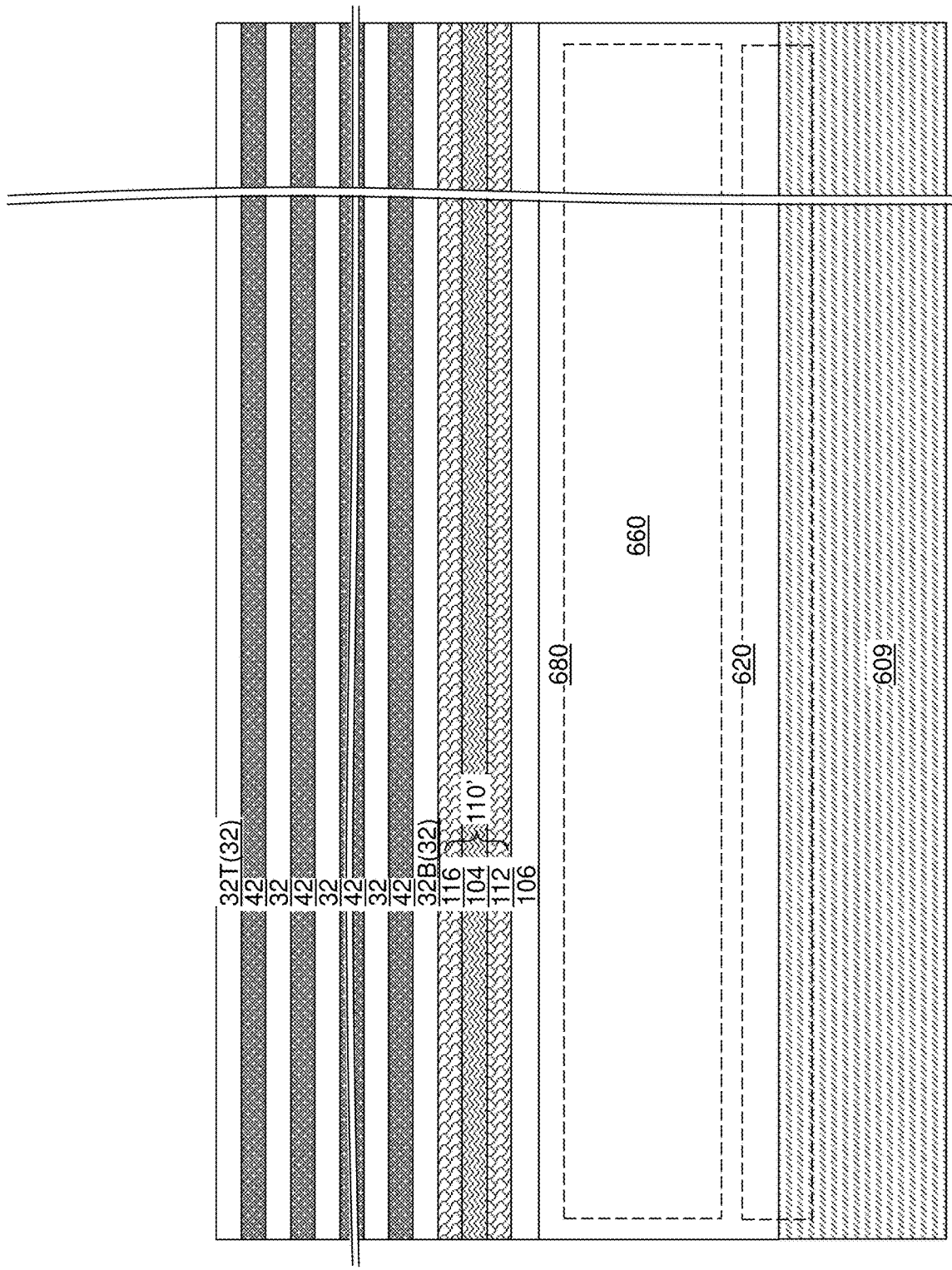
FIG. 24 is a vertical cross-sectional view of an alternative configuration of the exemplary structure after formation of an alternating stack of insulating layers and sacrificial material layers according to an embodiment of the present disclosure.

Referring to FIG. 24, an alternative configuration of the exemplary structure is illustrated. The alternative configuration of the exemplary structure can be provided by forming semiconductor devices 620 comprising a peripheral circuit for controlling operation of a three-dimensional memory device on a semiconductor substrate 609, by forming metal interconnect structures 680 embedded in dielectric material layers 660 over the semiconductor devices 620, and then forming the structural elements described with reference to FIG. 7 other than the carrier substrate 9. In other words, the combination of the semiconductor substrate 609, the semiconductor devices 620, the dielectric material layers 660, and the metal interconnect structures 680 can be employed in lieu of the carrier substrate 9. The semiconductor devices 620 may comprise the entirety of the control circuits described with reference to FIG. 3, or may comprise a fraction of the control circuits described with reference to FIG. 3.

Figure 25:
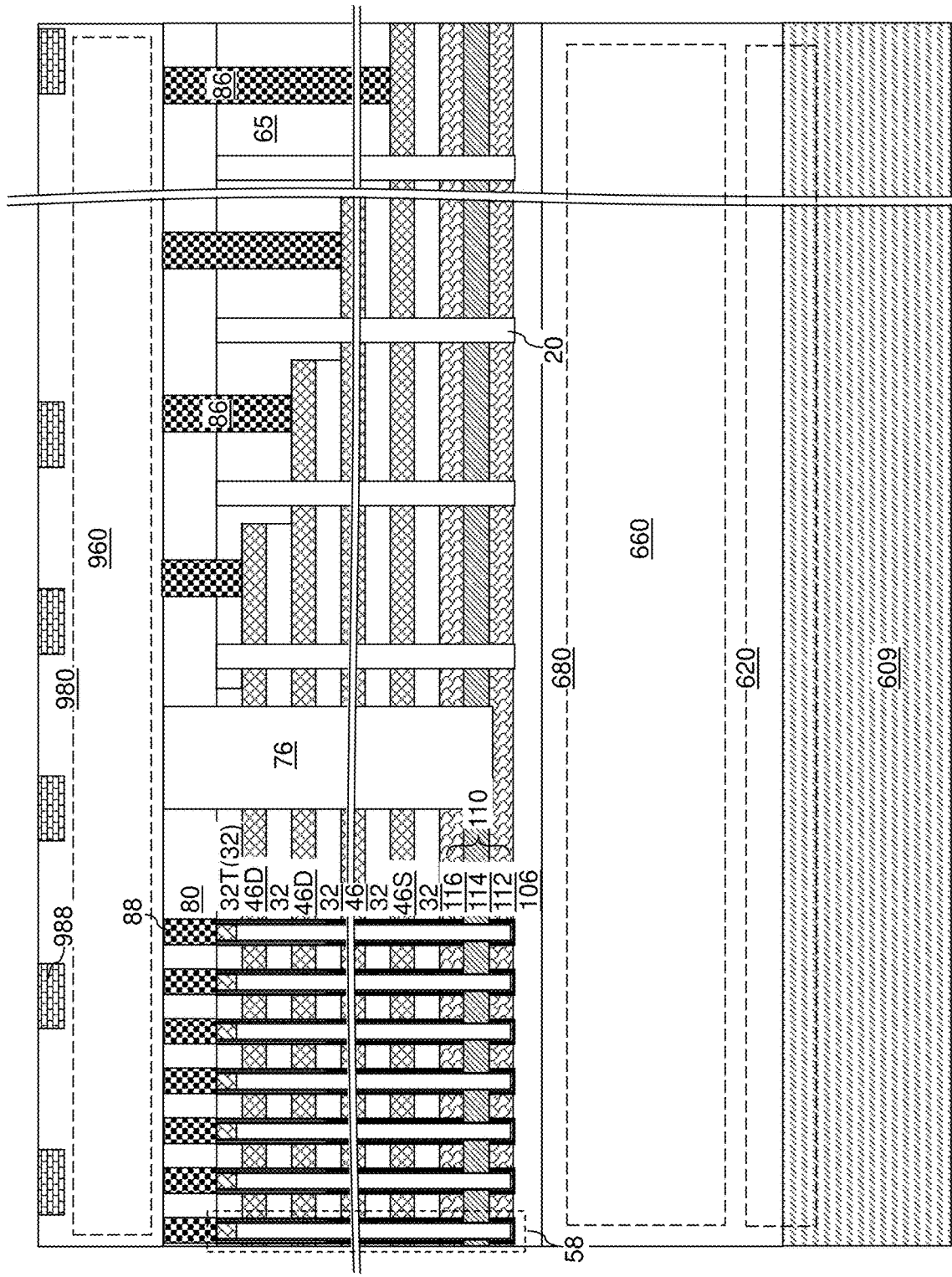
FIG. 25 is a vertical cross-sectional view of the alternative configuration of the exemplary structure after formation of memory-side metal interconnect structures and memory-side bonding pads according to an embodiment of the present disclosure.

Referring to FIG. 25, the processing steps described with reference to FIGS. 8-20 can be performed to provide a memory die, which may, or may not, be bonded to a logic die 700. In case the memory die of FIG. 25 is bonded to a logic die 700, the semiconductor devices 620 may comprise a first subset of a peripheral circuit for controlling operation of a three-dimensional memory device, and the logic die 700 may comprise a second subset of the peripheral circuit for controlling operation of a three-dimensional memory device.

In some embodiments, the semiconductor device of the present disclosure may comprises lateral isolation trench fill structures 76, wherein: each of the lateral isolation trench fill structures 76 is interposed between a respective neighboring pair among the plurality of memory blocks B_NM and the bit-line-bias block 102, and laterally extends along a first horizontal direction hd1; and each of the word lines and the additional word lines (as embodied as a subset of the electrically conductive layers 46) laterally extends along the first horizontal direction hd1 with a respective uniform width along a second horizontal direction hd2; and the bit lines 128 laterally extend along the second horizontal direction hd2.

The various embodiments of the present disclosure can be employed to provide a bit-line-bias block including a set of NAND strings, which can be employed as high voltage switches for the bit lines 128 during an erase operation and a programming operation.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Whenever two or more elements are listed as alternatives in a same paragraph of in different paragraphs, a Markush group including a listing of the two or more elements is also impliedly disclosed. Whenever the auxiliary verb "can" is employed in this disclosure to describe formation of an element or performance of a processing step, an embodiment in which such an element or such a processing step is not performed is also expressly contemplated, provided that the resulting apparatus or device can provide an equivalent result. As such, the auxiliary verb "can" as applied to formation of an element or performance of a processing step should also be interpreted as "may" or as "may, or may not" whenever omission of formation of such an element or such a processing step is capable of providing the same result or equivalent results, the equivalent results including somewhat superior results and somewhat inferior results. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. If publications, patent applications, and/or patents are cited herein, each of such documents is incorporated herein by reference in their entirety.

What is claimed is:

1. A semiconductor device, comprising:
   a plurality of memory blocks, wherein each memory block within the plurality of memory blocks comprises a respective alternating stack of insulating layers and word lines and a respective two-dimensional array of NAND strings, wherein each of the NAND strings comprises a respective vertical stack of memory elements, a respective vertical semiconductor channel, and a respective drain region;
   a bit-line-bias block located adjacent to the plurality of memory blocks and comprising an alternating stack of dummy insulating layers and dummy word lines and a two-dimensional array of dummy NAND strings, wherein each of the dummy NAND strings comprises a respective vertical stack of dummy memory elements, a respective dummy vertical semiconductor channel, and a respective dummy drain region;
   bit lines each extending over the plurality of memory blocks and the bit-line-bias block and electrically connected to a respective drain region within each memory block within the plurality of memory blocks and to a respective dummy drain region;
   a source line electrically connected to each end of the vertical semiconductor channels and the dummy vertical semiconductor channels located at an opposite side of the bit lines; and
   an erase operation control circuit configured to apply a source-drain erase bias voltage between the source line and the bit lines through the dummy vertical semiconductor channels within the bit-line-bias block during an erase operation.

2. The semiconductor device of claim 1, wherein the erase operation control circuit is configured to perform the erase operation to erase a first selected memory block of the plurality of memory blocks by applying a word-line erase bias voltage to word lines within the first selected memory block of the plurality of memory blocks while applying the source-drain erase bias voltage between the source line and the bit lines through the dummy vertical semiconductor channels within the bit-line-bias block.

3. The semiconductor device of claim 2, wherein the erase operation control circuit is configured to erase the first selected memory block by generating a gate induced leakage hole current from both source and drain sides of the vertical semiconductor channels in the first selected memory block.

4. The semiconductor device of claim 3, wherein the gate induced leakage hole current:
induces a first fraction of trapped electrons within the first selected memory block to be discharged during the erase operation by flowing from a first subset of charge storage elements within the first selected memory block, through first portions of the vertical semiconductor channels within the first selected memory block, and through the source line; and
induces a second fraction of the trapped electrons within the first selected memory block to be discharged during the erase operation by flowing from a second subset of the charge storage elements within the first selected memory block, through second portions of the vertical semiconductor channels within the first selected memory block, through the bit lines, through the dummy vertical semiconductor channels, and through the source line.

5. The semiconductor device of claim 2, wherein the bit lines are electrically connected only to:
the respective drain region within each memory block within the plurality of memory blocks;
the respective dummy drain region; and
a source or drain of a respective bit line switching transistor.

6. The semiconductor device of claim 5, wherein the respective bit line switching transistor further comprises another one of the source or the drain that is electrically connected to a respective sense amplifier.

7. The semiconductor device of claim 1, wherein:
dummy insulating layers comprise a same material and thickness as the insulating layers;
the dummy word lines comprise a same material and thickness as the word lines;
the vertical stack of dummy memory elements comprises a same material and thickness as the vertical stack of memory elements;
the dummy vertical semiconductor channel has a same material and thickness as the vertical semiconductor channel; and
the dummy drain region has a same material and thickness as the drain region.

8. The semiconductor device of claim 1, wherein the erase operation control circuit is configured to electrically bias each of the dummy word lines within the bit-line-bias block at a respective word line bias voltage that is not less than the source-drain erase bias voltage.

9. The semiconductor device of claim 8, wherein:
each of the plurality of memory blocks further comprises at least one source-side block select electrode and at least one drain-side block select electrode; and
the erase operation control circuit is configured to electrically bias, during the erase operation, each source-side block select electrode and each drain-side block select electrode within the first selected memory block at a respective bias voltage that is less than the source-drain erase bias voltage by greater than 0 V and less than 2 V.

10. The semiconductor device of claim 9, wherein:
the bit-line-bias block comprises at least one dummy source-side block select electrode and at least one dummy drain-side block select electrode; and
the erase operation control circuit is configured to electrically bias, during the erase operation, each dummy source-side block select electrode and each dummy drain-side block select electrode within the bit-line-bias block at a respective bias voltage that is greater than the source-drain erase bias voltage.

11. The semiconductor device of claim 1, wherein the erase operation control circuit is configured to electrically isolate the word lines in each of unselected blocks of the plurality of memory blocks during the erase operation such that the word lines in each of the unselected blocks are electrically floating.

12. The semiconductor device of claim 1, further comprising lateral isolation trench fill structures, wherein:
each of the lateral isolation trench fill structures is interposed between a respective neighboring pair of the plurality of memory blocks and the bit-line-bias block, and laterally extends along a first horizontal direction; and
each of the word lines and the dummy word lines laterally extends along the first horizontal direction with a respective uniform width along a second horizontal direction; and
the bit lines laterally extend along the second horizontal direction.

13. A method of performing the erase operation on the semiconductor device of claim 1, comprising:
applying a source-drain erase bias voltage between the source line and the bit lines through the dummy vertical semiconductor channels within the bit-line-bias block; and
erasing a first selected memory block of the plurality of memory blocks by applying a word-line erase bias voltage to word lines within the first selected memory block of the plurality of memory blocks while applying the source-drain erase bias voltage between the source line and the bit lines through the dummy vertical semiconductor channels within the bit-line-bias block.

14. The method of claim 13, wherein a gate induced leakage hole current is generated from both source and drain sides of the vertical semiconductor channels in the first selected memory block.

15. The method of claim 14, wherein:
a first fraction of tapped electrons within the first selected memory block is discharged by flowing from a first subset of charge storage elements within the first selected memory block, through first portions of vertical semiconductor channels within the first selected memory block, and through the source line; and
a second fraction of the tapped electrons within the first selected memory block is discharged by flowing from a second subset of the charge storage elements within the first selected memory block, through second portions of vertical semiconductor channels within the first selected memory block, through the bit lines, through the dummy vertical semiconductor channels, and through the source line.

16. The method of claim 13, further comprising electrically biasing each of the dummy word lines within the bit-line-bias block at a respective word line bias voltage that is not less than the source-drain erase bias voltage.

17. The method of claim 16, wherein:
each of the plurality of memory blocks comprises at least one source-side block select electrode and at least one drain-side block select electrode; and
the method further comprises electrically biasing, during the erase operation, each source-side block select electrode and each drain-side block select electrode within the selected memory block at a respective bias voltage that is less than the source-drain erase bias voltage by greater than 0 V and less than 2 V.

18. The method of claim 17, wherein the bit-line-bias block comprises at least one dummy source-side block select electrode and at least one dummy drain-side block select electrode.

19. The method of claim 18, further comprising electrically biasing, during the erase operation, each dummy source-side block select electrode and each dummy drain-side block select electrode within the bit-line-bias block at a respective bias voltage that is greater than the source-drain erase bias voltage.

20. The method of claim 18, further comprising:
pre-charging the at least one dummy source-side block select electrode and the at least one dummy drain-side block select electrode;
allowing the at least one dummy source-side block select electrode and the at least one dummy drain-side block select electrode to float after the pre-charging; and
allowing the at least one dummy source-side block select electrode and the at least one dummy drain-side block select electrode to charge to a voltage that is greater than the source-drain erase bias voltage by capacitive coupling at least one of the adjacent dummy word lines or the dummy vertical semiconductor channel.

* * * * *